United States Patent
Park et al.

(10) Patent No.: US 9,679,657 B2
(45) Date of Patent: Jun. 13, 2017

(54) SEMICONDUCTOR MEMORY DEVICE INCLUDING DUMMY MEMORY CELLS AND METHOD OF OPERATING THE SAME

(71) Applicant: SK hynix Inc., Icheon-si, Gyeonggi-do (KR)

(72) Inventors: Kyoung Jin Park, Seoul (KR); Sung Ho Bae, Seoul (KR); Byeong Il Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/988,518

(22) Filed: Jan. 5, 2016

(65) Prior Publication Data
US 2016/0336071 A1    Nov. 17, 2016

(30) Foreign Application Priority Data
May 15, 2015  (KR) .................... 10-2015-0068059

(51) Int. Cl.
| G11C 16/10 | (2006.01) |
| G11C 16/12 | (2006.01) |
| G11C 16/28 | (2006.01) |
| G11C 16/04 | (2006.01) |
| G11C 16/34 | (2006.01) |

(52) U.S. Cl.
CPC .......... *G11C 16/12* (2013.01); *G11C 16/0483* (2013.01); *G11C 16/10* (2013.01); *G11C 16/3459* (2013.01); *G11C 16/28* (2013.01)

(58) Field of Classification Search
CPC . G11C 16/12; G11C 16/0483; G11C 16/3459; G11C 16/28; G11C 16/10
USPC .............. 365/185.19, 185.2, 185.17, 185.18
See application file for complete search history.

(56) References Cited

U.S. PATENT DOCUMENTS

| 8,289,774 | B2* | 10/2012 | Moon ................ | G11C 16/0483 365/185.18 |
| 2007/0058428 | A1* | 3/2007 | Kang ................ | G11C 8/08 365/185.02 |
| 2007/0223273 | A1* | 9/2007 | Kang ................ | G11C 16/0483 365/185.2 |
| 2008/0304326 | A1* | 12/2008 | Kim ................ | G11C 16/14 365/185.22 |
| 2009/0003067 | A1* | 1/2009 | Kang ................ | G11C 16/0483 365/185.13 |

(Continued)

FOREIGN PATENT DOCUMENTS

| KR | 10-2006-0110755 A | 10/2006 |
| KR | 10-2012-0134941 A | 12/2012 |
| KR | 10-2013-0118033 A | 10/2013 |

*Primary Examiner* — Ly D Pham
(74) *Attorney, Agent, or Firm* — William Park & Associates Ltd.

(57) ABSTRACT

A method of operating a semiconductor memory device including a plurality of cell strings coupled to dummy word lines and normal word lines includes performing a first sub-program operation on selected normal memory cells by sequentially applying first program pulses to a selected normal word line and performing a second sub-program operation on the selected normal memory cells by sequentially applying second program pulses greater than the first program pulses to the selected normal word line, wherein at least one of the dummy word lines is biased in a same manner as the selected normal word line whenever each of the first program pulses is applied to the selected normal word line.

16 Claims, 15 Drawing Sheets

(56) References Cited

U.S. PATENT DOCUMENTS

| | | | |
|---|---|---|---|
| 2010/0074016 A1* | 3/2010 | Higashitani | G11C 11/5628 365/185.17 |
| 2010/0128522 A1* | 5/2010 | Choi | G11C 16/0483 365/185.2 |
| 2015/0221385 A1* | 8/2015 | Ahn | G11C 16/10 365/185.2 |
| 2015/0228345 A1* | 8/2015 | Kwon | G11C 16/10 365/185.18 |
| 2016/0099060 A1* | 4/2016 | Yoo | G11C 16/10 365/185.11 |

* cited by examiner

FIG. 10

| row line | voltage | | |
|---|---|---|---|
| DWL2 | Vpp | Vpp | Vpp |
| DWL1 | Vpp | Vpp | Vpp |
| WLsl | Vpgm1_1 | Vpgm1_2 | Vpgm1_3 |
| WLusl | Vpp | Vpp | Vpp |
| SWL2 | Vpgm1_1 | Vpgm1_2 | Vpgm1_3 |
| SWL1 | Vpp | Vpp | Vpp |

FIG. 11

| row line | voltage | | |
|---|---|---|---|
| DWL2 | Vpp | Vpp | Vpp |
| DWL1 | Vpp | Vpp | Vpp |
| WLsl | Vpgm2_1 | Vpgm2_2 | Vpgm2_p |
| WLusl | Vpp | Vpp | Vpp |
| SWL2 | Vpp | Vpp | Vpp |
| SWL1 | Vpp | Vpp | Vpp |

FIG. 12

| row line | voltage | | |
|---|---|---|---|
| DWL2 | Vpp | Vpp | Vpp |
| DWL1 | Vpp | Vpp | Vpp |
| WLsl | Vpgm1_1 | Vpgm1_2 | Vpgm1_3 |
| WLusl | Vpp | Vpp | Vpp |
| SWL2 | Vpgm1_1 | Vpgm1_2 | Vpgm1_3 |
| SWL1 | Vpgm1_1 | Vpgm1_2 | Vpgm1_3 |

SEMICONDUCTOR MEMORY DEVICE INCLUDING DUMMY MEMORY CELLS AND METHOD OF OPERATING THE SAME

CROSS-REFERENCE TO RELATED APPLICATION

The present application claims priority to Korean patent application number 10-2015-0068059 filed on May 15, 2015, in the Korean Intellectual Property Office, the entire disclosure of which is incorporated by reference herein.

BACKGROUND

1. Technical Field

Various embodiments relate generally to an electronic device and, more particularly, to a semiconductor memory device including dummy memory cells and a method of operating the same.

2. Related Art

Semiconductor memory devices are made of semiconductor materials such as silicon (Si), germanium (Ge), gallium arsenide (GaAs), and indium phosphide (InP). Semiconductor memory devices are classified into volatile memory devices and non-volatile memory devices.

Volatile memory devices lose stored data when powered off. Examples of volatile memory devices include Static RAM (SRAM), Dynamic RAM (DRAM) and Synchronous DRAM (SDRAM). Non-volatile memory devices retain stored data regardless of power on/off conditions. Examples of non-volatile memory devices include Read Only Memory (ROM), Mask ROM (MROM), Programmable ROM (PROM), Erasable Programmable ROM (EPROM), Electrically Erasable and Programmable ROM (EEPROM), flash memory, Phase-change Random Access Memory (PRAM), Magnetic RAM (MRAM), Resistive RAM (RRAM) and Ferroelectric RAM (FRAM). Flash memories are classified into NOR-type memories and NAND-type memories.

BRIEF SUMMARY

Various embodiments relate to a semiconductor memory device having improved performance and a method of operating the same.

A method of operating a semiconductor memory device including a plurality of cell strings coupled to dummy word lines and normal word lines according to an embodiment may include performing a first sub-program operation on selected normal memory cells by sequentially applying first program pulses to a selected normal word line, among the normal word lines, and performing a second sub-program operation on the selected normal memory cells by sequentially applying second program pulses greater than the first program pulses to the selected normal word line, wherein at least one of the dummy word lines is biased in the same manner as the selected normal word line whenever each of the first program pulses is applied to the selected normal word line.

The at least one of the dummy word lines may be biased to a program pass pulse lower than the second program pulses whenever each of the second program pulses is applied to the selected normal word line.

Unselected normal word lines, among the normal word lines, may be biased to the program pass pulse whenever each of the second program pulses is applied to the selected normal word line.

Unselected normal word lines, among the normal word lines, may be biased to a program pass pulse lower than the first program pulses whenever each of the first program pulses is applied to the selected normal word line.

A method of operating a semiconductor memory device including a plurality of cell strings coupled to a dummy word line and normal word lines according to another embodiment may include commonly applying a first program pulse to a selected normal word line, among the normal word lines, and the dummy word line until selected normal memory cells correspond to a first program pass, and applying second program pulses to the selected normal word line until the selected normal memory cells correspond to a second program pass, wherein whether the selected normal memory cells correspond to the first program pass is determined using a sub-verify voltage, and whether the selected normal memory cells correspond to the second program pass is determined using a target verify voltage greater than the sub-verify voltage.

A semiconductor memory device according to another embodiment may include a memory cell array including dummy memory cells coupled to dummy word lines and normal memory cells coupled to normal word lines, and a peripheral circuit performing first sub-programs on selected normal memory cells by applying first program pulses to a selected normal word line, among the normal word lines, and performing second sub-programs on the selected normal memory cells by applying second program pulses to the selected normal word line during a program operation, wherein the peripheral circuit controls a voltage of a selected dummy word line, among the dummy word lines, during each of the first sub-programs in the same manner as the selected normal word line.

BRIEF DESCRIPTION OF THE DRAWINGS

FIG. 10 is a table showing voltages applied to normal word lines and dummy word lines during a first sub-program operation;

FIG. 11 is a table showing voltages applied to normal word lines and dummy word lines during a second sub-program operation;

FIG. 12 is a table showing another embodiment of voltages applied to a first sub-program operation;

DETAILED DESCRIPTION

Hereinafter, various examples of embodiments will be described in detail with reference to the accompanying drawings. The figures are provided to allow those with ordinary skill in the art to understand a scope of the embodiments of the invention. The present invention may, however, be embodied in different forms and should not be construed as limited to the embodiments set forth. Rather, these embodiments are provided so that this disclosure will be thorough and complete. In addition, the embodiments are provided to fully convey a scope of the invention to those skilled in the art.

Furthermore, 'connected/coupled' represents that one component is directly electrically coupled to another component or indirectly electrically coupled through another component. A singular form may include a plural form as long as it is not specifically mentioned in a sentence. Furthermore, 'include/comprise' or 'including/comprising' used in the specification represents that one or more components, steps, operations, and elements exists or have been added.

Figure 1:
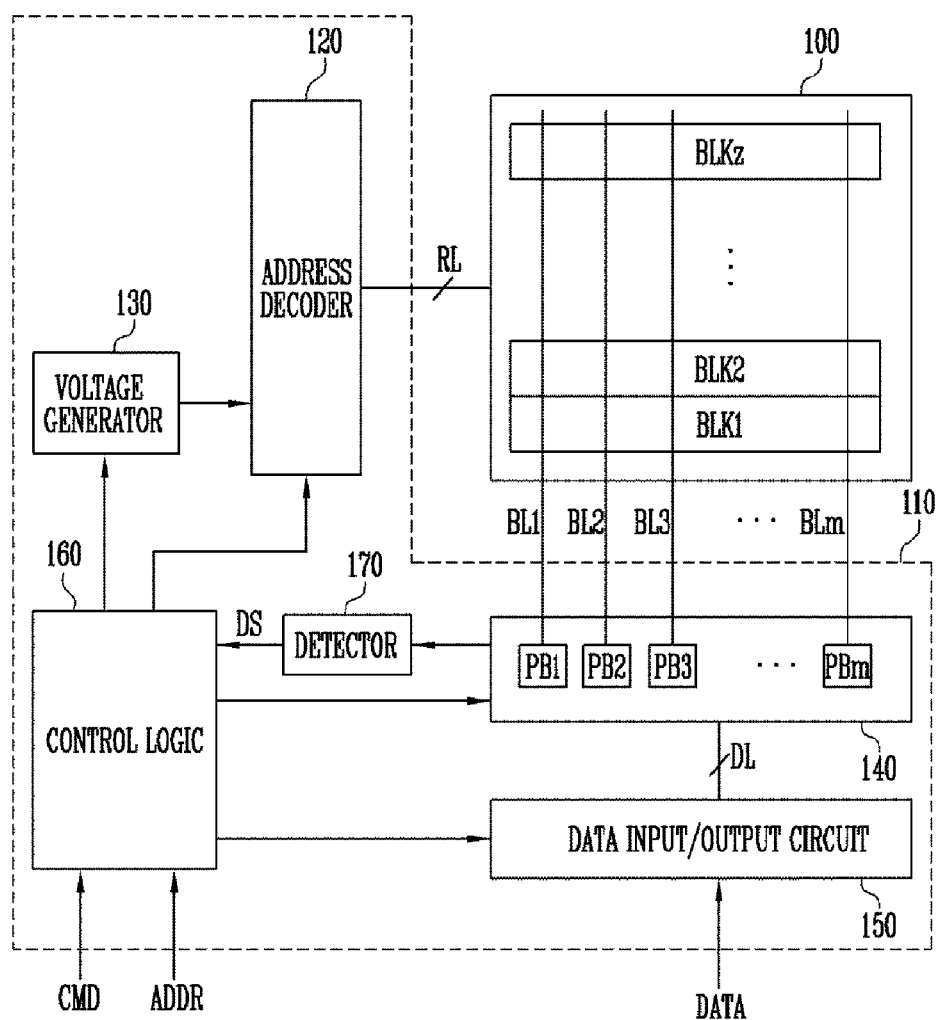
FIG. 1 is a block diagram illustrating a semiconductor memory device according to an embodiment.

FIG. 1 is a block diagram illustrating a semiconductor memory device 50 according to an embodiment.

Referring to FIG. 1, the semiconductor memory device 50 may include a memory cell array 100 and a peripheral circuit 110.

The memory cell array 100 may include a plurality of memory blocks BLK1 to BLKz. The memory blocks BLK1 to BLKz may be coupled to an address decoder 120 through row lines RL, and the memory blocks BLK1 to BLKz may be coupled to a read and write circuit 140 through bit lines BL1 to BLm. Each of the memory blocks BLK1 to BLKz may include a plurality of memory cells. According to an embodiment, the plurality of memory cells may be non-volatile memory cells.

The peripheral circuit 110 may include the address decoder 120, a voltage generator 130, a read and write circuit 140, a data input/output circuit 150, a control logic 160 and a detector 170.

The address decoder 120 may be coupled to the memory cell array 100 through the row lines RL. The row lines RL may include drain selection lines, normal word lines, dummy word lines, source selection lines and a common source line. According to an embodiment, the row lines RL may further include a pipe line.

The address decoder 120 may be configured to operate the row lines RL in response to control of the control logic 160. The address decoder 120 may receive an address ADDR from the control logic 160.

During a program operation, the address ADDR may include a block address and a row address. The address decoder 120 may be configured to decode a block address from the received address ADDR. The address decoder 120 may select one memory block in response to the decoded block address. The address decoder 120 may also be configured to decode a row address from the received address ADDR. The address decoder 120 may select one of the drain selection lines of the selected memory block in response to the decoded row address and select one of a plurality of normal word lines, which may be divided into first normal word lines and second normal word lines, of the selected memory block. Therefore, normal memory cells corresponding to a single page may be selected.

According to an embodiment, the address decoder 120 may include a block decoder, a row decoder and an address buffer.

The voltage generator 130 may operate in response to the control logic 160. The voltage generator 130 may generate an internal power voltage by using an external power voltage provided to the semiconductor memory device 50. For example, the voltage generator 130 may regulate the external power voltage to generate the internal power voltage. The generated internal power voltage may be provided to the address decoder 120, the read and write circuit 140, the data input/output circuit 150, the control logic 160 and the detector 170, and used as an operating voltage of the semiconductor memory device 50.

The voltage generator 130 may generate a plurality of voltages using at least one of the external power voltage and the internal power voltage. According to an embodiment, the voltage generator 130 may include a plurality of pumping capacitors receiving the internal power voltage and generating a plurality of voltages by selectively activating the plurality of pumping capacitors in response to control of the control logic 160.

During a program, the voltage generator 130 may generate a high-voltage program pulse and a program pass pulse lower than the program pulse. The address decoder 120 may apply the program pulse to a selected normal word line and the program pass pulse to unselected normal word lines based on the address ADDR. During a program verify, the voltage generator 130 may generate a verify voltage and a verify pass voltage greater than the verify voltage. The address decoder 120 may apply the verify voltage to the selected normal word line and the verify pass voltage to the unselected normal word lines based on the address ADDR.

The read and write circuit 140 may be coupled to the memory cell array 100 through bit lines BL. The read and write circuit 140 may operate in response to control of the control logic 160.

The read and write circuit 140 may communicate data DATA with the data input/output circuit 150 through data lines DL. During a program operation, the read and write circuit 140 may receive data DATA through the data input/output circuit 150.

The read and write circuit 140 may include first to mth page buffers PB1 to PBm. The first to mth page buffers PB1 to PBm may be coupled to the memory cell array 100 through the first to mth bit lines BL1 to BLm, respectively. The first to mth page buffers PB1 to PBm may operate in response to control of the control logic 160.

During a program operation, the first to mth page buffers PB1 to PBm may receive data DATA to be programmed from the data input/output circuit 150 and the data lines DL. When a program pulse is applied to the selected normal word line, the first to mth page buffers PB1 to PB may program selected normal memory cells through the bit lines BL1 to BLm according to the data DATA to be programmed. A threshold voltage of a normal memory cell of a bit line to which a program permission voltage (e.g., ground voltage)

is applied may increase. On the other hand, a threshold voltage of a normal memory cell of a bit line to which a program inhibition voltage (e.g., power voltage) is applied may be maintained. During a program verify operation, the first to mth page buffers PB1 to PBm may read data from the selected normal memory cells through the bit lines BL1 to BLm, respectively. A value of the data may be determined based on whether or not the threshold voltage of the selected normal memory cells is less than, greater than or equal to the verify voltage. For example, when the threshold voltage of the selected normal memory cell is less than the verify voltage, a corresponding data bit may be determined to have a logic value "1." When the threshold voltage of the selected normal memory cell is greater than or equal to the verify voltage, the corresponding data bit may be determined as having a logic value "0." Subsequently, the first to mth page buffers PB1 to PBm may generate pass/fail bits by determining whether the read data and the data DATA to be programmed coincide with each other. The generated pass/fail bits may be transferred to the detector 170.

During a program operation, the data input/output circuit 150 may receive data DATA to be programmed from an external device and transfer the data DATA to be programmed to the read and write circuit 140.

The control logic 160 may be coupled to the address decoder 120, the voltage generator 130, the read and write circuit 140, the data input/output circuit 150 and the detector 170. The control logic 160 may receive a command CMD and the address ADDR from an external controller. The control logic 160 may be configured to control the address decoder 120, the voltage generator 130, the read and write circuit 140, the data input/output circuit 150 and the detector 170 in response to the command CMD. The control logic 160 may transfer the address ADDR to the address decoder 120.

The detector 170 may be coupled to the read and write circuit 140 and the control logic 160. The detector 170 may operate in response to control of the control logic 160. The detector 170 may enable a detection signal DS when the number of data bits corresponding to a program pass, among the pass/fail bits, is greater than a predetermined number. The detector 170 may disable the detection signal DS when the number of data bits corresponding to the program pass, among the pass/fail bits, is smaller than or equal to the predetermined number.

According to an embodiment, a program operation may include a first sub-program operation and a second sub-program operation. When the detection signal DS is enabled during the first sub-program operation, the control logic 160 may control the peripheral circuit 110 to perform the second sub-program operation. When the detection signal DS is enabled during the second sub-program operation, the control logic 160 may complete the program operation. The control logic 160 may transfer a program pass signal to an external controller (not illustrated) to inform the external controller that the program operation is completed.

Figure 2:
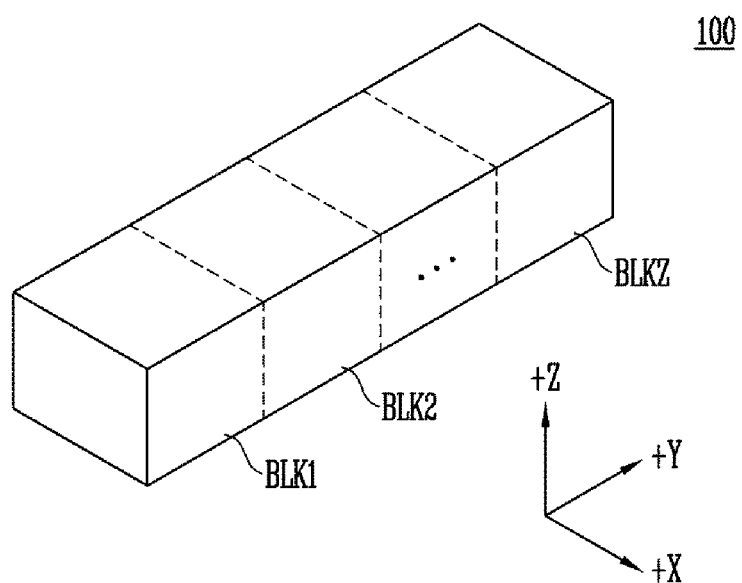
FIG. 2 is a block diagram illustrating an embodiment of a memory cell shown in FIG. 1.

FIG. 2 is a block diagram illustrating an embodiment of the memory cell array 100 shown in FIG. 1.

Referring to FIG. 2, the memory cell array 100 may include a plurality of memory blocks BLK1 to BLKz. Each of the memory blocks may have a three-dimensional structure. Each of the memory blocks may include a plurality of memory cells which are stacked over a substrate. The plurality of memory cells may be arranged in a +X direction, a +Y direction and a +Z direction. The structure of each memory block is described in more detail with reference to FIG. 3.

Figure 3:
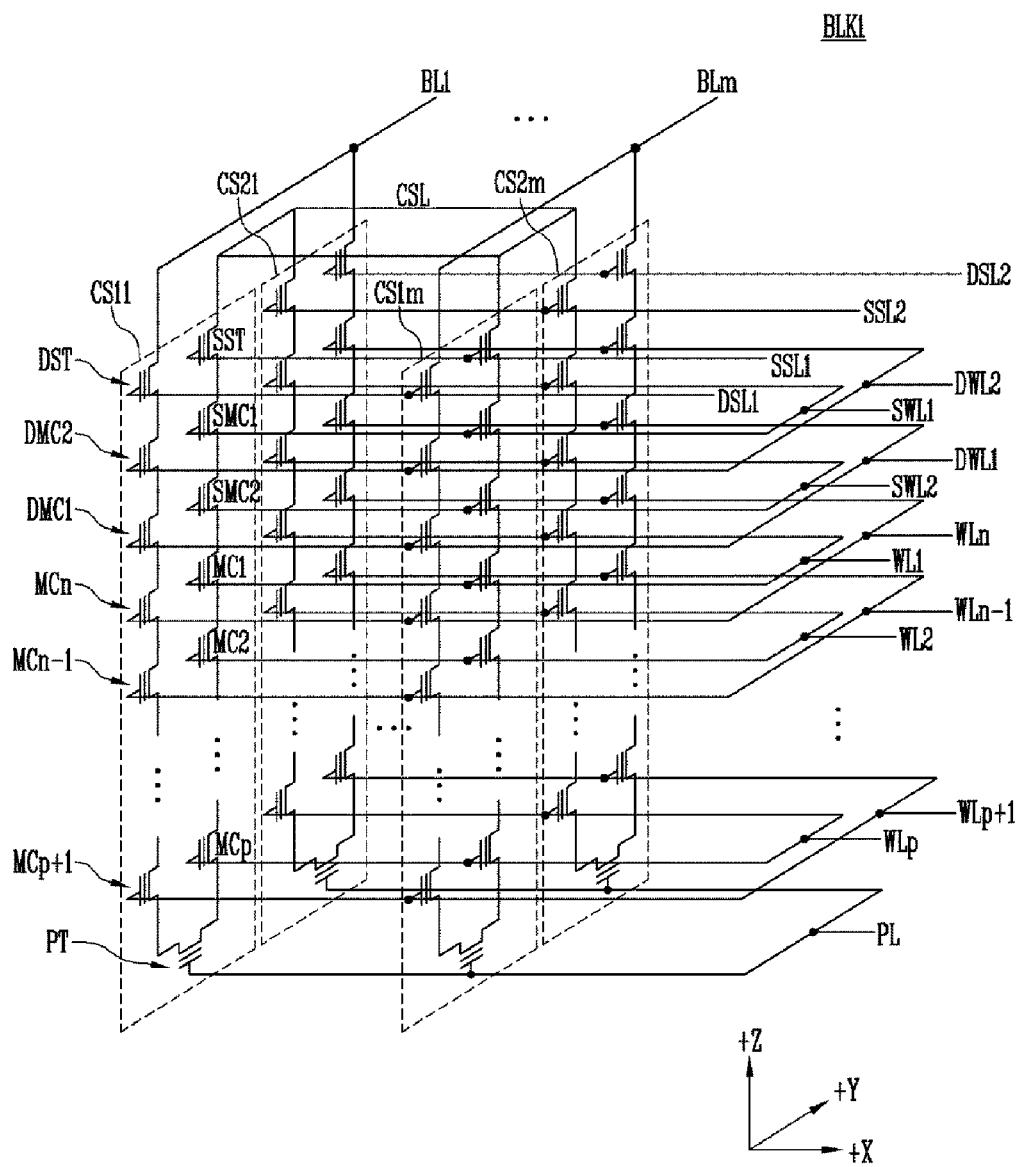
FIG. 3 is a circuit diagram illustrating one of the memory blocks shown in FIG. 2.

FIG. 3 is a circuit diagram illustrating one of the memory blocks BLK1 to BLKz shown in FIG. 2, i.e., a first memory block BLK1.

Referring to FIG. 3, the first memory block BLK1 may include cell strings CS11 to CS1$m$ and CS21 to CS2$m$. According to an embodiment, each of the cell strings CS11 to CS1$m$ and CS21 to CS2$m$ may be formed into a 'U' shape. In the first memory block BLK1, m cell strings may be arranged in a row direction (i.e., +X direction). For convenience of explanation, FIG. 3 illustrates two cell strings arranged in a column direction (i.e., +Y direction). However, three or more cell strings may be arranged in the column direction.

Each of the cell strings CS11 to CS1$m$ and CS21 to CS2$m$ may include at least one source selection transistor SST, one or more source side dummy memory cells SMC1 and SMC2, first to nth normal memory cells MC1 to MCn, a pipe transistor PT, one or more drain side dummy memory cells DMC1 and DMC2, and at least one drain selection transistor DST. In one example embodiment, a plurality of first normal memory cells may be coupled to the first normal word lines, and second memory cells may be coupled to the second normal word lines.

The selection transistors SST and DST, the dummy memory cells SMC1, SMC2, DMC1, and DMC2 and the normal memory cells MC1 to MCn may have similar structures. According to an embodiment, each of the selection transistors SST and DST, the dummy memory cells SMC1, SMC2, DMC1, and DMC2 and the normal memory cells MC1 to MCn may include a channel layer, a tunneling insulating layer, a charge storage layer and a blocking insulating layer.

A source selection transistor SST of each cell string may be coupled between a common source line CSL and the source side dummy memory cells SMC1 and SMC2.

According to an embodiment, source selection transistors of cell strings arranged in the same row may be coupled to a source selection line extending in a row direction. Source selection transistors of cell strings arranged in different rows may be coupled to different source selection lines. As shown in FIG. 3, the source selection transistors of the cell strings CS11 to CS1$m$ in the first row may be coupled to a first source selection line SSL1, and the source selection transistors of the cell strings CS21 to CS2$m$ in the second row may be coupled to a second source selection line SSL2.

Two source side dummy memory cells SMC1 and SMC2 may be provided to each cell string. In other embodiments, however, it will be understood that three or more source side dummy memory cells may be provided. The source side dummy memory cells SMC1 and SMC2 of each cell string may be coupled in series between the source selection transistor SST and the normal memory cells MC1 to MCp. A gate of the first source side dummy memory cell SMC1 of each cell string may be coupled to a first source side dummy word line SWL1. A gate of the second source side dummy memory cell SMC2 may be coupled to a second source side dummy word line SWL2. The first to nth normal memory cells MC1 to MCn of each cell string may be coupled between the source side dummy memory cells SMC1 and SMC2 and the drain side dummy memory cells DMC1 and DMC2.

The first to nth normal memory cells MC1 to MCn may be divided into first to pth normal memory cells MC1 to MCp, and (p+1)th to nth normal memory cells MCp+1 to MCn. The first to pth normal memory cells MC1 to MCp may be sequentially arranged in a reverse direction to the +Z direction and coupled in series between the source side dummy memory cells SMC1 and SMC2 and the pipe transistor PT. The (p+1)th to nth normal memory cells MCp+1 to MCn may be sequentially arranged in the +Z direction and coupled in series between the pipe transistor PT and the drain side dummy memory cells DMC1 and DMC2. The first to pth normal memory cells MC1 to MCp and the (p+1)th to nth normal memory cells MCp+1 to MCn are coupled through the pipe transistor PT. Gates of first to nth normal memory cells MC1 to MCn of each cell string may be coupled to first to nth normal word lines WL1 to WLn, respectively.

Data may be stored in the first to nth normal memory cells MC1 to MCn through the first to mth bit lines BL1 to BLm. The data stored in the first to nth normal memory cells MC1 to MCn may be read through the first to mth bit lines BL1 to BLm.

A gate of the pipe transistor PT of each cell string may be coupled to the pipe line PL.

For illustrative purposes, two drain side dummy memory cells DMC1 and DMC2 are shown provided to each cell string but, three or more drain side dummy memory cells may be provided to each cell string. The drain side dummy memory cells DMC1 and DMC2 of each of the cell strings may be coupled in series between the drain selection transistor DST and the normal memory cells MCp+1 to MCn. A gate of the first drain side dummy memory cell DMC1 of each cell string may be coupled to a first drain side dummy word line DWL1. A gate of the second drain side dummy memory cell DMC2 of each cell string may be coupled to a second drain side dummy word line DWL2.

The drain selection transistor DST of each cell string may be coupled between the corresponding bit line and the drain side dummy memory cells DMC1 and DMC2. Cell strings arranged in a row direction may be coupled to a drain selection line extending in the row direction. Drain selection transistors of the cell strings CS11 to CS1*m* in a first row may be coupled to a first drain selection line DSL1. Drain selection transistors of the cell strings CS21 to CS2*m* in a second row may be coupled to a second drain selection line DSL2.

Cell strings arranged in a column direction may be coupled to a bit line extending in the column direction. In FIG. 3, the cell strings CS11 and CS21 in a first column may be coupled to the first bit line BL1. The cell strings CS1*m* and CS2*m* in an mth column may be coupled to the mth bit line BLm.

According to another embodiment, even bit lines and odd bit lines may be provided instead of the first to mth bit lines BL1 to BLm. In addition, even cell strings of the cell strings CS11 to CS1*m* or CS21 to CS2*m* arranged in the row direction may be coupled to the even bit lines, respectively, and odd cell strings of the cell strings CS11 to CS1*m* or CS21 to CS2*m* arranged in the row direction may be coupled to the odd bit lines, respectively.

The dummy memory cells SMC1, SMC2, DMC1, and DMC2 may be provided to stably control a voltage or current of the corresponding cell string. For example, the source side dummy memory cells SMC1 and SMC2 may be provided to reduce an electric field between the source selection transistor SST and the normal memory cells MC1 to MCp. In another example, the drain side dummy memory cells DMC1 and DMC2 may be provided to reduce an electric field between the drain selection transistor DST and the normal memory cells MCp+1 to MCn. When more dummy memory cells are provided, the operational reliability of the memory block BLK1 may improve, but the size of the memory block BLK1 may increase. When fewer dummy memory cells are provided, the size of the memory block BLK1 may be reduced, and the operational reliability of the memory block BLK1 may be lowered.

To efficiently control the dummy memory cells SMC1, SMC2, DMC1, and DMC2, the dummy memory cells SMC1, SMC2, DMC1, and DMC2 may have desired threshold voltages. After an erase operation on the memory block BLK1 is performed, program operations may be performed on a portion of or on an entirety of the dummy memory cells SMC1, SMC2, DMC1, and DMC2. According to the program operations, the dummy memory cells SMC1, SMC2, DMC1, and DMC2 may have desired threshold voltages. However, when separate program operations are performed on the dummy memory cells SMC1, SMC2, DMC1, and DMC2, the performance of the semiconductor memory device 50 may be degraded.

Figure 4:
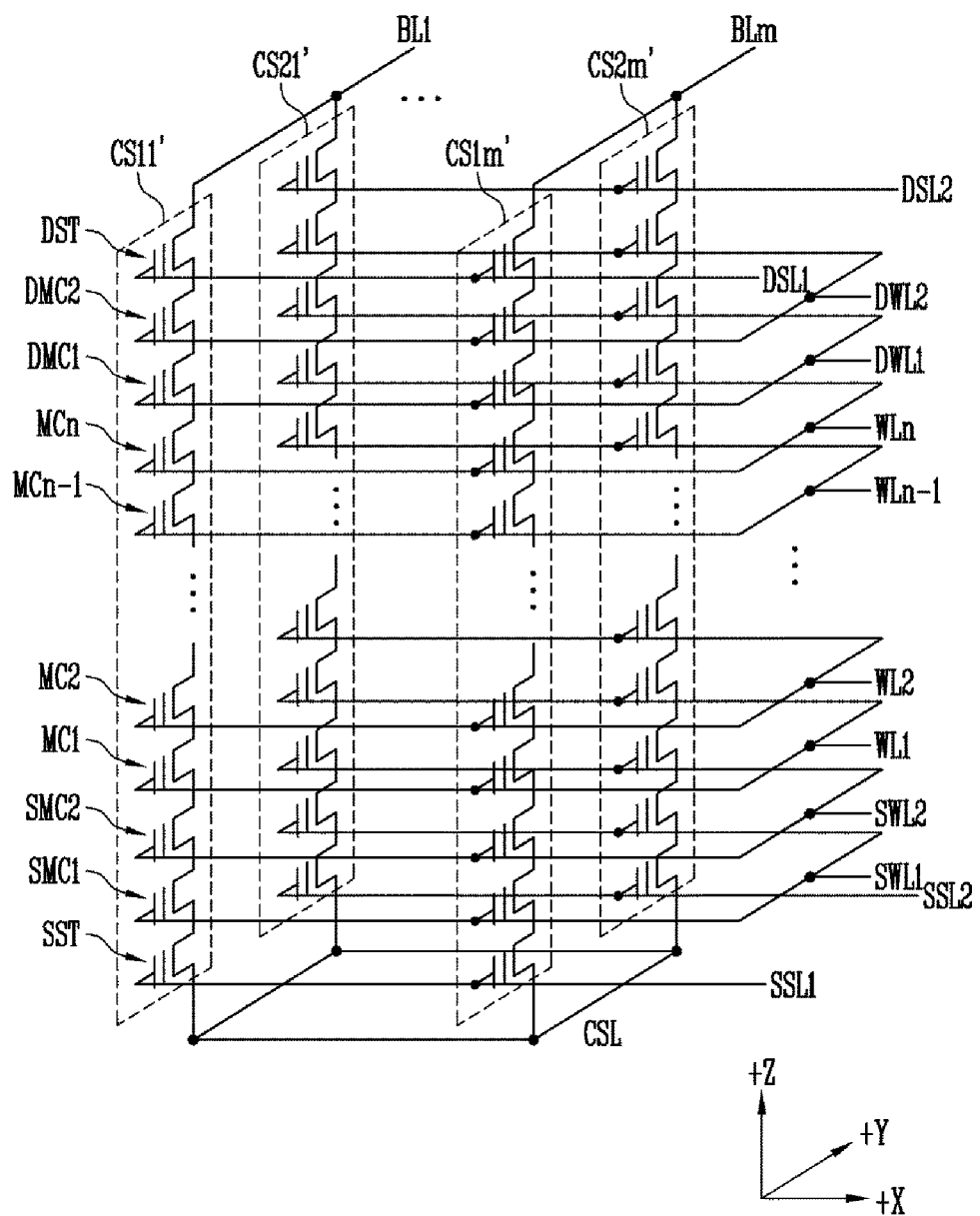
FIG. 4 is a circuit diagram illustrating another embodiment of one of the memory blocks shown in FIG. 2.

FIG. 4 is a circuit diagram illustrating another embodiment (BLK1') of one (BLK1) of the memory blocks BLK1 to BLKz shown in FIG. 2.

Referring to FIG. 4, a first memory block BLK1' may include a plurality of cell strings CS11' to CS1*m*' and CS21' to CS2*m*'. Each of the cell strings CS11' to CS1*m*' and CS21' to CS2*m*' may extend in the +Z direction. Each of the cell strings CS11' to CS1*m*' and CS21' to CS2*m*' may include at least one source selection transistor SST, one or more source side dummy memory cells SMC1 and SMC2, first to nth normal memory cells MC1 to MCn, one or more drain side dummy memory cells DMC1 and DMC2, and at least one drain selection transistor DST stacked over a substrate (not illustrated) under the memory block BLK1'.

The source selection transistor SST of each cell string may be coupled between a common source line CSL and the source side dummy memory cells SMC1 and SMC2. Source selection transistors of cell strings (e.g., CS11' to CS1*m*') arranged in the same row may be coupled to the same source selection line (e.g., SSL1). Source selection transistors of the cell strings CS11' to CS1*m*' arranged in a first row may be coupled to a first source selection line SSL1. Source selection transistors of the cell strings CS21' to CS2*m*' arranged in a second row may be coupled to a second source selection line SSL2.

The source side dummy memory cells SMC1 and SMC2 of each cell string may be coupled in series between the source selection transistor SST and the normal memory cells MC1 to MCn. Source side dummy memory cells at the same height may be coupled to the same source side dummy word line. Gates of the first and second source side dummy memory cells SMC1 and SMC2 may be coupled to the first and second source side dummy word lines SWL1 and SWL2, respectively.

The first to nth normal memory cells MC1 to MCn of each cell string may be coupled in series between the source side dummy memory cells SMC1 and SMC2 and the drain side dummy memory cells DMC1 and DMC2. The gates of the first to nth normal memory cells MC1 to MCn may be coupled to the first to nth normal word lines WL1 to WLn, respectively.

The drain side dummy memory cells DMC1 and DMC2 of each cell string may be coupled in series between the drain selection transistor DST and the normal memory cells MC1 to MCn. Drain side dummy memory cells at the same height may be coupled to the same source side dummy word line. The first and second drain side dummy memory cells DMC1 and DMC2 may be coupled to the first and second drain side dummy word lines DWL1 and DWL2, respectively.

The drain selection transistor DST of each cell string may be coupled between a corresponding bit line and the drain side dummy memory cells DMC1 and DMC2. Drain selection transistors of cell strings arranged in a row direction may be coupled to a drain selection line extending in the row direction. Drain selection transistors of the cell strings CS11' to CS1m' in the first row may be coupled to the first drain selection line DSL1. Drain selection transistors of the cell strings CS21' to CS2m' in the second row may be coupled to the second drain selection line DSL2.

As a result, the memory block BLK1' shown in FIG. 4 may have an equivalent circuit similar to that of the memory block BLK1 shown in FIG. 3, except that the pipe transistor PT is removed from each cell string.

Hereinafter, for convenience of explanation, an embodiment of the present invention is described below on the basis of the memory block BLK1 shown in FIG. 3.

Figure 5:
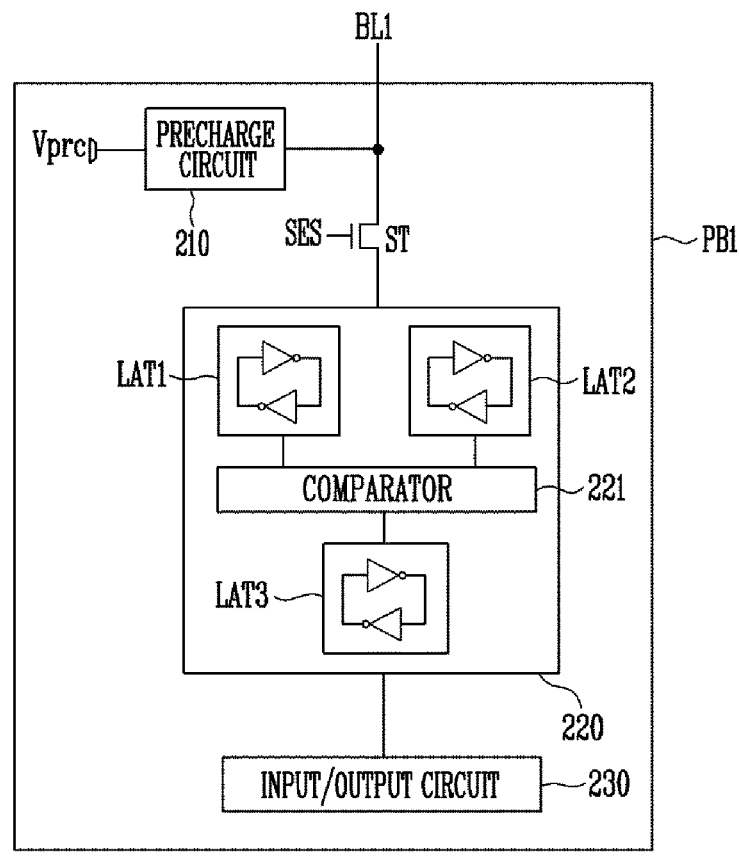
FIG. 5 is a block diagram illustrating one of the page buffers shown in FIG. 1.

FIG. 5 is a block diagram illustrating one (PB1) of the page buffers PB1 to PBm shown in FIG. 1.

Referring to FIG. 5, the first page buffer PB1 may include a precharge circuit 210, a bit line selection transistor ST, a sensing circuit 220 and an input/output circuit 230.

The precharge circuit 210 may be coupled to the bit line BL1. During a program verify operation, the precharge circuit 210 may transfer a precharge voltage Vprc to the first bit line BL1 in response to control of the control logic 160 shown in FIG. 1. According to an embodiment, the precharge circuit 210 may include a switching device operating in response to control of the control logic 160.

The bit line selection transistor ST may be coupled between the first bit line BL1 and the sensing circuit 220. In response to a sensing signal SES from the control logic 160, the bit line selection transistor ST may electrically connect the bit line BL1 and the sensing circuit 220.

The sensing circuit 220 may be coupled to the first bit line BL1 through the bit line selection transistor ST. The sensing circuit 220 may include a plurality of latches LAT1 to LAT3 and a comparator 221. During the program verify operation, when the bit line selection transistor ST is turned on, the sensing circuit 220 may sense a voltage or current in the first bit line BL1 and store the corresponding data in the first latch LAT1.

The second latch LAT2 may store a data bit showing a voltage state which a corresponding normal memory cell has as a result of a program operation. The second latch LAT2 may store a data bit corresponding to a normal memory cell coupled to the first bit line BL1 from the data DATA to be programmed as shown in FIG. 1. When the normal memory cell is a single level cell, as shown in FIG. 5, the single second latch LAT2 may be provided to store a single data bit. When the normal memory cell is a multi level cell, two or more second latches may be provided to store two or more data bits.

The comparator 221 may compare the data bit stored in the first latch LAT1 with the data bit stored in the second latch LAT2 to generate a pass/fail bit. The generated pass/fail bit may be stored in the third latch LAT3.

The input/output circuit 230 may be coupled to the sensing circuit 220. The input/output circuit 230 may output the pass/fail bit of the third latch LAT3 to the detector 170 in response to the control logic 160.

Figure 6:
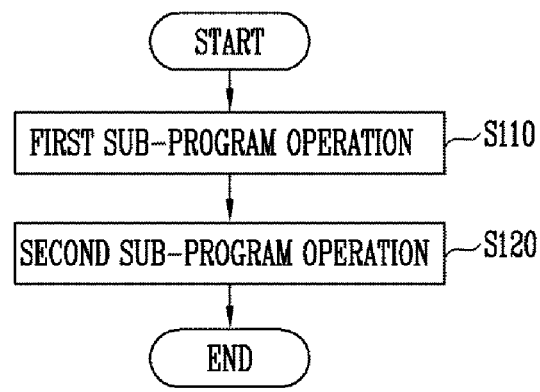
FIG. 6 is a flowchart illustrating a method of a program operation of a semiconductor memory device according to an embodiment.

FIG. 6 is a flowchart illustrating a method of a program operation of the semiconductor memory device 50 according to an embodiment.

Referring to FIGS. 1 and 6, at step S110, the semiconductor memory device 50 may perform a first sub-program operation in response to the command CMD indicating a program. The peripheral circuit 110 may sequentially apply first program pulses to a selected normal word line of a selected memory block to program selected normal memory cells.

According to an embodiment, whenever each of the first program pulses is applied to the selected normal word line, any one of the dummy word lines coupled to the selected memory block may be biased in the same manner as in the selected normal word line. Therefore, dummy memory cells coupled to the corresponding dummy word line may be programmed.

The dummy memory cells may be programmed during a program operation on the selected normal memory cells, which may mean that a separate program operation with respect to the dummy memory cells is not required. Therefore, the performance of the semiconductor memory device 50 may be improved.

At step S120, the semiconductor memory device 50 may perform a second sub-program operation. The peripheral circuit 110 may program the selected normal memory cells by sequentially applying second program pulses to the selected normal word line.

According to an embodiment, when each of the second program pulses is applied to the selected normal word line, the dummy memory cells coupled to the dummy word line may not be programmed. Instead of the second program pulses, a program pass pulse, which may be lower than the second program pulses, may be applied or biased to the dummy word line, whenever, for example, each of the second program pulses is applied to the selected normal word line. Therefore, the dummy memory cells coupled to the corresponding dummy word line may be prevented from being over-programmed.

Figure 7:
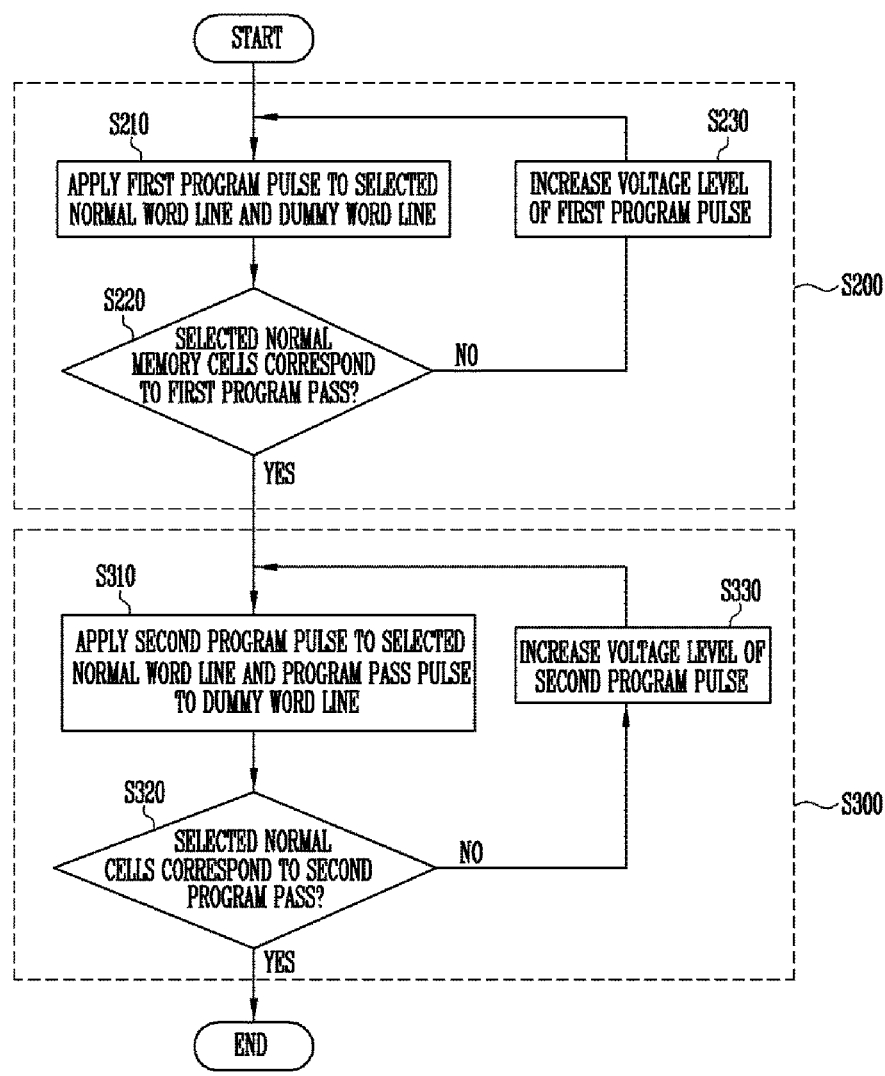
FIG. 7 is a flowchart illustrating a method of a program operation shown in FIG. 6 in detail.

FIG. 7 is a flowchart illustrating the method of a program operation shown in FIG. 6.

Referring to FIGS. 1, 3 and 7, at step S200, a first sub-program operation may be performed. The first sub-program operation may include steps S210 to S230.

At step S210, a first program pulse may be, in one example, commonly applied to a selected normal word line and a selected dummy word line. The first program pulse is applied, in one example, until selected normal memory cells correspond to a first program pass. In one embodiment, the peripheral circuit 110 controls a voltage of the selected dummy word line during each of the first sub-programs in a substantially similar manner as the selected word line. A description is made with reference to FIG. 7 on the assumption that the first normal word line WL1 is selected and the second source side dummy word line SWL2 is selected.

By controlling the source selection lines SSL1 and SSL2 of the selected memory block, the cell strings CS11 to CS1m and CS21 to CS2m may be electrically separated from the common source line CSL.

A ground voltage may be applied to an unselected drain selection line (e.g., DSL2) of the drain selection lines DSL1 and DSL2 of the selected memory block. Drain selection transistors of the unselected drain selection line may be turned off, and corresponding cell strings may be electrically separated from the bit lines BL1 to BLm. A power voltage may be applied to a selected drain selection line (e.g., DSL1) of the drain selection lines DSL1 and DSL2 of the selected memory block. Therefore, cell strings coupled to the selected drain selection line may be determined as selected cell strings (e.g., CS11 to CS1m).

A program pass pulse which is lower than the first program pulse may be applied to unselected normal word lines WL2 to WLn. The program pass pulse may also be applied to unselected dummy word lines SWL1, DWL1, and DWL2. The first program pulse having a high voltage may be applied to the selected normal word line WL1. In the same manner, the first program pulse may be applied to the selected dummy word line SWL2.

Each of the normal memory cells and the dummy memory cells receiving the first program pulse having a high voltage may be programmed in response to data transferred through the corresponding bit line.

When a program inhibition voltage (e.g., power voltage) is applied to a bit line (e.g., BLm), even if the power voltage is applied to the selected drain selection line, the corresponding drain selection transistor may be turned off and a channel of the corresponding cell string (e.g., CS1m) may be electrically separated from the bit line. The corresponding cell string may be separated from the bit line and the common source line and floated. When the first program pulse is applied, a voltage of the channel of the corresponding cell string may be boosted by the first program pulse. Since a difference between the boosted voltage of the channel and the first program pulse is not large, threshold voltages of a normal memory cell and a dummy memory cell of the corresponding cell string are possibly not increased.

When the program permission voltage (e.g., ground voltage) is applied to the bit line (e.g., BL1), the corresponding drain selection transistor may be turned on by the power voltage of the selected drain selection line, and a channel of the cell string (e.g., CS11) may receive the program permission voltage from the bit line. The difference between the program permission voltage of the channel and the first program pulse may increase the threshold voltages of the normal memory cell and the dummy memory cell in the corresponding cell string.

Therefore, when the threshold voltage of the selected normal memory cell is maintained, the threshold voltage of the dummy memory cell may be maintained. When the threshold voltage of the selected normal memory cell increases, the threshold voltage of the dummy memory cell may also increase.

At step S220, whether the selected normal memory cells correspond to a first program pass may be determined by performing a program verify using a sub-verify voltage. The sub-verify voltage may be lower than a target verify voltage.

Threshold voltages of selected normal memory cells may be read using the sub-verify voltage. The read and write circuit 140 may provide an arbitrary voltage or current to the bit lines BL1 to BLm. The address decoder 120 may electrically connect the selected cell strings CS11 to CS1m to the bit lines BL1 to BLm and the common source line CSL by applying the power voltage to the selected drain selection line (e.g., DSL1) and the selected source selection line (e.g., SSL1). The address decoder 121 may apply the verify pass voltage to the unselected normal word lines WL2 to WLn and the dummy word lines SWL1, SWL2, DWL1, and DWL2. The dummy memory cells SMC1 and SMC2 and the normal memory cells MC1 to MCn may be turned on regardless of the threshold voltages thereof.

The address decoder 120 may apply the sub-verify voltage to the selected normal word line WL1. When the voltage or current provided to the bit line is emitted to the common source line CSL, it may mean that a threshold voltage of a selected normal memory cell MC1 of the corresponding cell string may be lower than the sub-verify voltage. When the voltage or current provided to the bit line is maintained, it may mean that the threshold voltage of the selected normal memory cell MC1 of the corresponding cell string may be greater than or equal to the sub-verify voltage.

Each of the page buffers PB1 to PBm may generate the pass/fail bit based on the data bit read through the corresponding bit line. When the read data bit coincides with the data bit indicating a voltage state into which the corresponding normal memory cell is programmed, a pass/fail bit (e.g., logic value "1") indicating a program pass may be generated. When the read data bit does not coincide with the data bit indicating the voltage state into which the corresponding normal memory cell is programmed, a pass/fail bit (e.g., logic value "0") indicating a program fail may be generated.

The pass/fail bits may be transferred to the detector 170. When the number of pass/fail bits indicating the program pass is greater than a predetermined number, the detector 170 may enable a detection signal DS. For example, when all pass/fail bits indicate the program passed, the detector 170 may enable the detection signal DS. The detection signal DS may be transferred to the control logic 160.

When the number of pass/fail bits indicating the program passed is greater than a predetermined number, it may mean that the selected normal memory cells correspond to the first program pass. When the selected normal memory cells correspond to the first program pass, step S310 may be performed. When the selected normal memory cells do not correspond to the first program pass, step S230 may be performed.

At step S230, the voltage generator 130 may be set to increase the voltage level of the first program pulse. Subsequently, step S210 may be performed using the increased first program pulse. The first program pulses which increase gradually may be applied to the selected normal word line and the dummy word line until the selected normal memory cells correspond to the first program pass.

At step S300, the second sub-program operation may be performed. The second sub-program operation may include steps S310 to S330.

At step S310, the second sub-program may be performed by applying the second program pulse to the selected normal word line WL1. In one example, the second program pulse is applied until the selected normal memory cells corresponding to the second program pass. In an embodiment, the peripheral circuit 110 controls a voltage of the selected dummy word line during each of the second sub-programs in a substantially similar manner as an unselected word line. According to an embodiment, when the second program pulse is applied to the selected normal word line WL1, the program pass pulse may be applied to the selected dummy word line SWL2. In other words, dummy memory cells of the selected dummy word line SWL2 are possibly not programmed during the second sub-program.

The drain selection lines DSL1 and DSL2, the unselected normal word lines WL2 to WLn, the unselected dummy word lines SWL1, DWL1, and DWL2, and the bit lines BL1 to BLm may be controlled in the same manner as in the first sub-program program. Hereinafter, a description of the overlapping contents is omitted.

At step S320, whether the selected normal memory cells correspond to a second program pass may be determined by performing a program verify using the target verify voltage.

The threshold voltages of the selected normal memory cells may be read using the target verify voltage. The address decoder 120 may apply the target verify voltage to the selected normal word line WL1. The bit lines BL1 to BLm, the common source line CSL, the drain selection lines DSL1 and DSL2, the normal word lines WL2 to WLn, the dummy word lines SWL1, SWL2, DWL1, and DWL2, and the source selection lines SSL1 and SSL2 may be controlled in the same manner as in the program verify using the sub-verify voltage. Hereinafter, a description of the overlapping contents is omitted.

Each of the page buffers PB1 to PBm may generate a pass/fail bit based on the data bit read through the bit line. The generated pass/fail bits may be transferred to the detector 170. The detector 170 may enable the detection signal DS when the number of pass/fail bits indicating the program pass is greater than or equal to the predetermined number.

When the number of pass/fail bits indicating the program pass is greater than or equal to the predetermined number, it may mean that the selected normal memory cells correspond to the second program pass. When the selected normal memory cells do not correspond to the second program pass, step S330 may be performed. When the selected normal memory cells correspond to the second program pass, the program operation may be terminated.

At step S330, the voltage generator 130 may be set to increase a voltage level of the second program pulse. Hereinafter, step S310 may be performed using the increased second program pulse. The second program pulses, which increase gradually, may be applied to the selected normal word line and the dummy word line until the selected normal memory cells correspond to the second program pass.

According to an embodiment, in the same manner as normal memory cells, dummy memory cells may be programmed until the selected normal memory cells correspond to the first program pass. When the dummy memory cells are programmed during the program operation of the selected normal memory cells, a separate program operation on the dummy memory cells is possibly not required. Therefore, the performance of the semiconductor memory device 50 may be improved.

Figure 8:
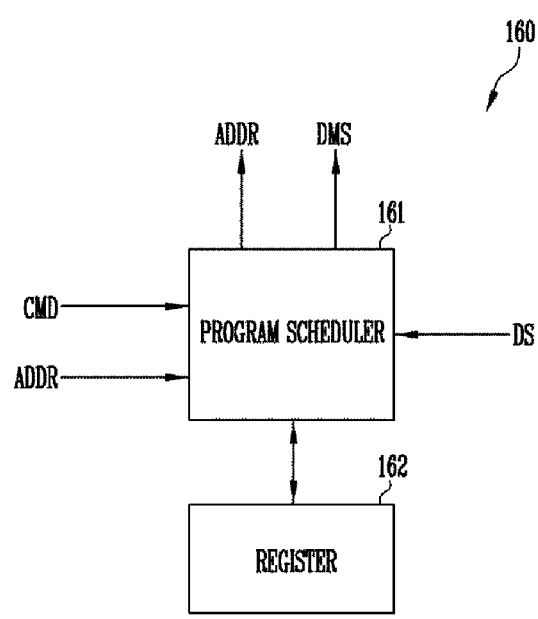
FIG. 8 is a block diagram illustrating one embodiment of a control logic shown in FIG. 1.

FIG. 8 is a block diagram illustrating one embodiment of the control logic 160 shown in FIG. 1.

Referring to FIGS. 1 and 8, the control logic 160 may include a program scheduler 161 and a register 162. The program scheduler 161 may be configured to control the address decoder 120, the voltage generator 130, the read and write circuit 140, the data input/output circuit 150 and the detector 170 in response to the command CMD.

The register 162 may store normal word line addresses showing predetermined normal word lines, respectively. For example, normal word line addresses may be stored in one of the memory blocks BLK1 to BLKz and loaded to the register 162 from the corresponding memory block when the semiconductor memory device 50 is powered up.

The program scheduler 161 may be coupled to the register 162. The program scheduler 161 may output a dummy selection signal DMS to the address decoder 120 when the address ADDR coincides with one of the normal word line addresses. One of the dummy word lines may be selected in response to the dummy selection signal DMS. The address decoder 120 may apply the first program pulse to a dummy word line indicated by the dummy selection signal DMS when the first program pulse is applied to the selected normal word line. When the detection signal DS is disabled, the address decoder 120 may output the dummy selection signal DMS along with the address ADDR. The address decoder 120 may not output the dummy selection signal DMS when the detection signal DS is enabled. The address decoder 120 may apply the second program pulse only to the selected normal word line.

According to an embodiment, the register 162 may store a normal word line address indicating a normal word line and a dummy word line address indicating a corresponding dummy word line. The program scheduler 161 may acquire the a corresponding dummy word line address from the register 162 when the address ADDR coincides with one of the normal word line addresses stored in the register 162. The program scheduler 161 may output the acquired dummy word line address as the dummy selection signal DMS.

According to an embodiment, when a program operation is performed on the first normal memory cell MC1 adjacent to the source side dummy memory cells SMC1 and SMC2, one of the source side dummy memory cells SMC1 and SMC2 may be programmed. For example, when a program operation is performed on the first normal memory cell MC1, the second source side dummy memory cell SMC2 adjacent to the first normal memory cell MC1 may be programmed. For example, when a program operation is performed on each of the first to qth normal memory cells MC1 to MCq, the second source side dummy memory cells SMC2 may be programmed, where q is a natural number greater than 1 and smaller than p.

According to an embodiment, when a program operation is performed on an nth normal memory cell MCn adjacent to the drain side dummy memory cells DMC1 and DMC2, one of the drain side dummy memory cells DMC1 and DMC2 may be programmed. For example, during a program operation of the nth normal memory cell MCn, the first drain side dummy memory cell DMC1 adjacent to the nth normal memory cell MCn may be programmed. For example, when a program operation is performed on each of rth to nth normal memory cells MCr to MCn, where r is a natural number greater than p+1 and smaller than n, the first drain side dummy memory cell DMC1 may be programmed.

Figure 9:
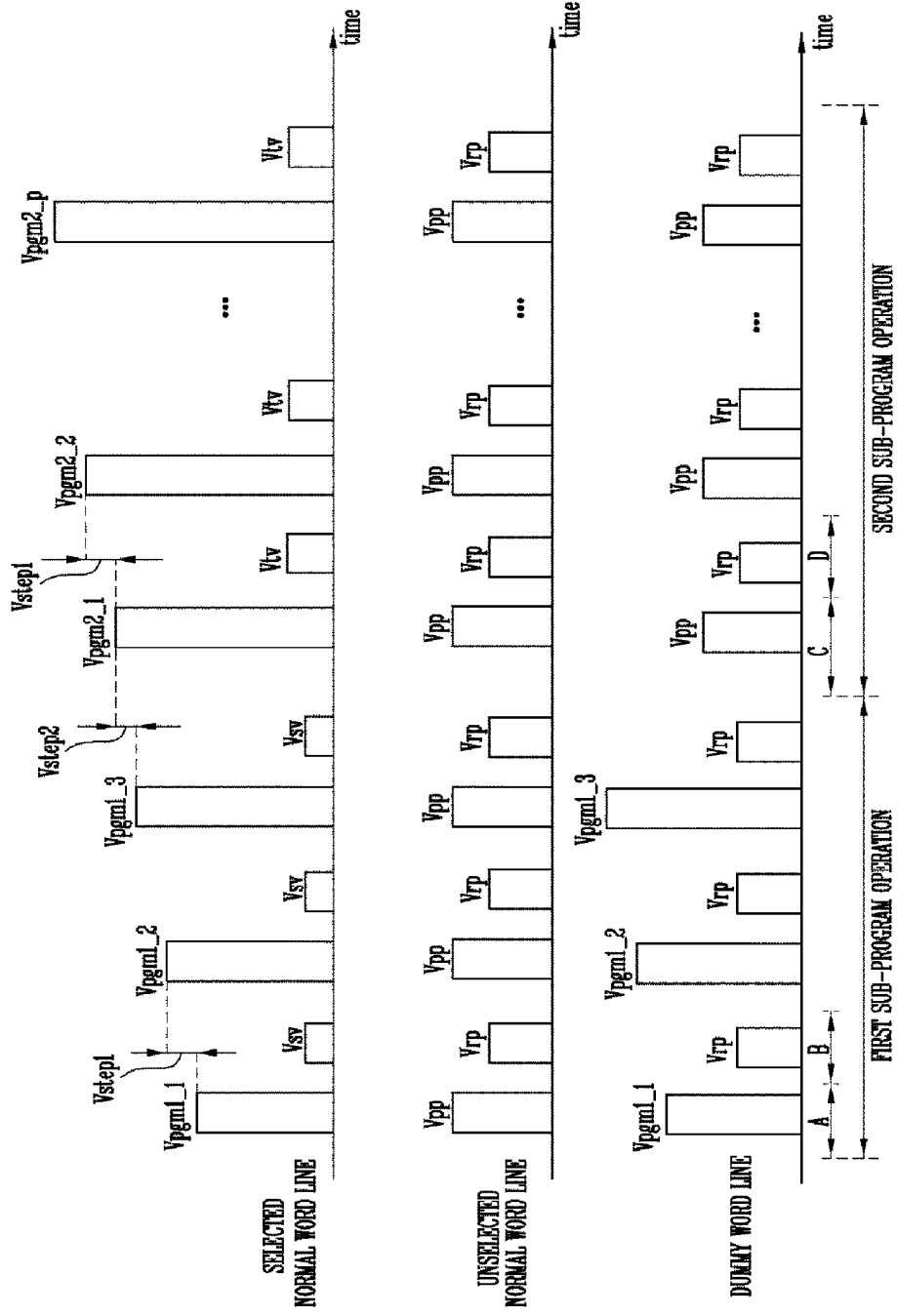
FIG. 9 is a timing diagram illustrating voltages applied to a selected normal word line, an unselected normal word line and a selected dummy word line during a first sub-program operation and a second sub-program operation.

FIG. 9 is a timing diagram illustrating voltages applied to a selected normal word line, an unselected normal word line and a selected dummy word line during a first sub-program operation and a second sub-program operation.

Referring to FIGS. 3 and 9, a first sub-program A may be performed. A first program pulse pgm1_1 may be applied to a selected normal word line (e.g., WL1). A program pass pulse Vpp lower than the first program pulse pgm1_1 may be applied to unselected normal word lines (e.g., WL2 to WLn). Consequently, unselected normal word lines (e.g., WL2 to WLn) may be biased to a program pass pulse Vpp lower than the first program pulses pgm1_1 whenever each of the first program pulses pgm1_1 may be applied to the selected normal word line (e.g., WL1). In the same manner as in the selected normal word line, the first program pulse pgm1_1 may be applied to a selected dummy word line (e.g., SWL2). Though not shown in FIG. 9, the remaining dummy word lines (e.g., SWL1, DWL1 and DWL2) may be biased in the same manner as unselected normal word lines.

Subsequently, a program verify B on the selected normal memory cells may be performed using a sub-verify voltage Vsv. During the first sub-program operation, a program verify may be performed using the sub-verify voltage Vsv. The sub-verify voltage Vsv may be applied to the selected normal word line. A verify pass voltage Vrp may be applied to the unselected normal word lines and the selected dummy word line. The unselected dummy word lines may be biased in the same manner as the unselected normal word lines.

The first sub-program A and the program verify B may be repeated until a result of the program verify using the sub-verify voltage Vsv corresponds to a pass. First program pulses pgm1_2 and pgm1_3, which increase gradually, may be applied to the selected normal word line. The program pulses pgm1_2 and pgm1_3 may be gradually increased by a first step voltage Vstep1. The selected dummy word line may be biased in the same manner as the selected normal word line whenever each of the program pulses pgm1_2 and pgm1_3 is applied to the selected normal word line. The program pass pulse Vpp may be applied to the unselected normal word lines.

Assuming that the result of the program verify using the sub-verify voltage Vsv corresponds to a pass, selected normal memory cells may correspond to a first program pass. A second sub-program C may be performed. A second program pulse Vpgm2_1 may be applied to the selected normal word line during the second sub-program C. A program may not be performed on the selected dummy word line during the second sub-program operation. The program pass pulse Vpp may be applied to the selected dummy word line as well as the unselected normal word lines.

A lowest program pulse, among the second program pulses Vpgm2_1 may be greater than the highest program pulse Vpgm1_3, among first program pulses Vpgm1_1 to Vpgm1_3, by a second step voltage Vstep2. The second step voltage Vstep2 may be lower than the first step voltage Vstep1.

Assuming that the program pass pulse Vpp is applied to at least one row line, for example a selected normal word line, adjacent to the selected normal word line, the program pass pulse Vpp may be lower than the program pulse. Even when the selected normal word line is biased to the program pulse, a voltage of the selected normal word line may be slowly increased due to the influence of the program pass pulse Vpp on the adjacent row lines. On the other hand, if at least one dummy word line adjacent to the selected normal word line is selected and the program pulse is applied to both the selected normal word line and the selected dummy word line according to an embodiment, a voltage level of the selected normal word line may be relatively rapidly increased. By reducing the second step voltage Vstep2 to be lower than the first step voltage Vstep1, a rapid increase in the threshold voltage of the selected normal memory cell may be prevented.

Subsequently, a program verify D may be performed using a target verify voltage Vtv. A program verify may be performed using the target verify voltage Vtv during the second sub-program operation. The target verify voltage Vtv may be applied to the selected normal word line to determine, in one example, whether the selected normal memory corresponds to the program pass. The sub-verify voltage Vsv may be lower than the target verify voltage Vtv. The verify pass voltage Vrp may be applied to the unselected normal word lines and the selected dummy word line. The unselected dummy word lines may be biased in substantially the same manner as the unselected normal word lines. Under such conditions, data may be read from the selected normal memory cells through the bit lines BL1 to BLm. The second sub-program C and the program verify D may be repeated until a result of the program verify using the target verify voltage Vtv corresponds to a pass. Second program pulses pgm2_2 to pgm2_p which increase gradually may be applied to the selected normal word line. The second program pulses pgm2_2 to pgm2_p may be gradually increased by the first step voltage Vstep1. Whenever each of the second program pulses pgm2_2 to pgm2_p is applied, the selected dummy word line may be biased in the same manner as the unselected normal word lines. When the result of the program verify using the target verify voltage Vtv corresponds to a pass, the program operation may be terminated.

FIG. 10 is a table showing voltages applied to the normal word lines WL1 to WLn and the dummy word lines SWL1, SWL2, DWL1, and DWL2 during the first sub-program operation. For convenience of explanation, a description is made based on the assumption that the second source side dummy word line SWL2 is selected from among the dummy word lines SWL1, SWL2, DWL1, and DWL2 with reference to FIGS. 10 and 11.

Referring to FIG. 10, the first program pulses Vpgm1_1 to Vpgm1_3, which increase gradually, may be applied to a selected normal word line WLsI until the selected normal memory cells correspond to the first program pass. The selected dummy word line SWL2 may be biased in the same manner as the selected normal word line WLsI. Whenever each of the first program pulses Vpgm1_1 to Vpgm1_3 is applied, unselected normal word lines WLusI and the remaining dummy word lines SWL1, DWL1, and DWL2 may be biased to the program pass pulse Vpp.

FIG. 11 is a table showing voltages applied to the normal word lines WL1 to WLn and the dummy word lines SWL1, SWL2, DWL1, and DWL2 during the second sub-program operation.

Referring to FIG. 11, the second program pulses Vpgm2_1 to Vpgm2_p, which increase gradually, may be applied to the selected normal word line WLsI. The selected dummy word line SWL2 may be biased in the same manner as the unselected normal word lines WLusI. Whenever each of the second program pulses Vpgm2_1 to Vpgm2_p is applied to the selected normal word line WLsI, the unselected normal word lines WLusI and the dummy word lines SWL1, SWL2, DWL1, and DWL2 may be biased to the program pass pulse Vpp.

FIG. 12 is a table showing another embodiment of the voltages applied to the normal word lines WL1 to WLn and the dummy word lines SWL1, SWL2, DWL1, and DWL2 during the first sub-program operation.

According to an embodiment, two or more dummy word lines may be selected during a program operation on a normal word line. For convenience of explanation, a description is made with reference to FIG. 12 on the assumption that the dummy word lines SWL1, SWL2, DWL1, and DWL2 and the first and second source side dummy word lines SWL1 and SWL2 are selected.

Referring to FIG. 12, the first program pulses Vpgm1_1 to Vpgm1_3 which increase gradually may be applied to the selected normal word line WLsI until the selected normal memory cells correspond to the first program pass. The selected dummy word lines SWL1 and SWL2 may be biased in the same manner as the selected normal word line WLsI. Whenever each of the first program pulses Vpgm1_1 to Vpgm1_3 is applied, the unselected normal word lines WLusI and the remaining dummy word lines DWL1 and DWL2 may be biased to the program pass pulse Vpp.

Figure 13:
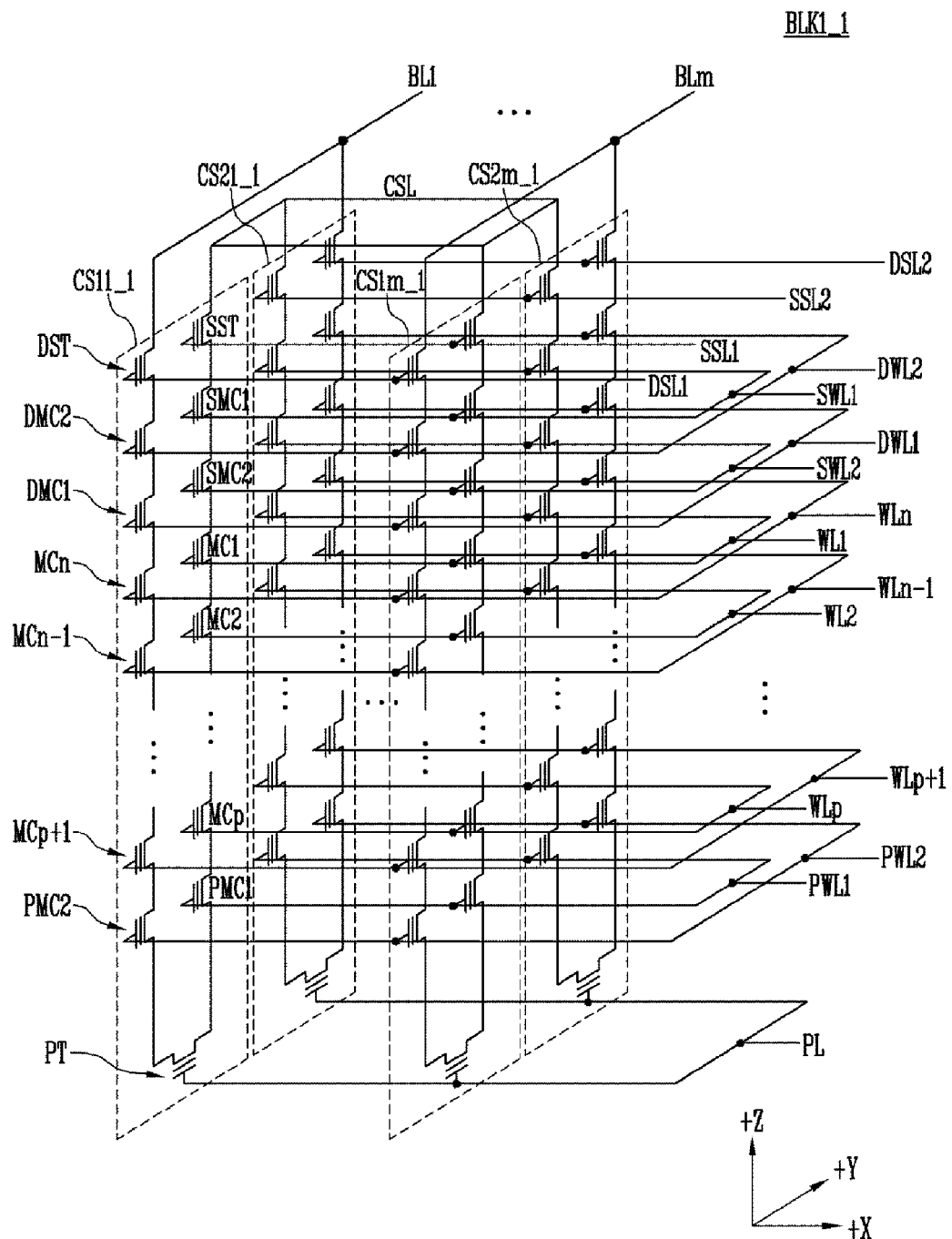
FIG. 13 is a block diagram illustrating another embodiment of one of the memory blocks shown in FIG. 2.

FIG. 13 is a circuit diagram illustrating another embodiment (BLK1_1) of one (BLK1) of the memory blocks BLK1 to BLKz shown in FIG. 2.

Referring to FIG. 13, a first memory block BLK1_1 may include cell strings CS11_1 to CS1m_1 and CS21_1 to CS2m_1.

Each of the cell strings CS11_1 to CS1m_1 and CS21_1 to CS2m_1 may include a source selection transistor SST, source side dummy memory cells SMC1 and SMC2, normal memory cells MC1 to MCn, at least one first pipe dummy memory cell PMC1, a pipe transistor PT, at least one second pipe dummy memory cell PMC2, drain side dummy memory cells DMC1 and DMC2, and a drain selection transistor DST. In comparison with the embodiment shown in FIG. 3, first and second pipe dummy memory cells PMC1 and PMC2 may be further provided in each cell string in this embodiment.

The first and second pipe dummy memory cells PMC1 and PMC2 may be coupled to both ends of the pipe transistor PT. The first pipe dummy memory cell PMC1 may be coupled between the pipe transistor PT and the first to pth normal memory cells MC1 to MCp. The second pipe dummy memory cell PMC2 may be coupled between the pipe transistor PT and the (p+1)th to nth normal memory cells MCp+1 to MCn. Gates of the first and second pipe dummy memory cells PMC1 and PMC2 may be coupled to first and second pipe dummy word lines PWL1 and PWL2, respectively.

Since the first and second pipe dummy memory cells PMC1 and PMC2 are provided, a voltage or current in the cell string may be stably controlled. For example, since the first pipe dummy memory cell PMC1 is provided, an electric field between the pipe transistor PT and the normal memory cells MC1 to MCp may be reduced. For example, when the second pipe dummy memory cell PMC2 is provided, an electric field between the pipe transistor PT and the normal memory cells MCp+1 to MCn may be reduced.

According to an embodiment, a program on pipe dummy memory cells may be performed at the same time as a program on normal memory cells. Whenever each of the first program pulses is applied to the elected normal word line, the first and second pipe dummy word lines PWL1 and PWL2 may be biased in the same manner as in the selected normal word line.

Figure 14:
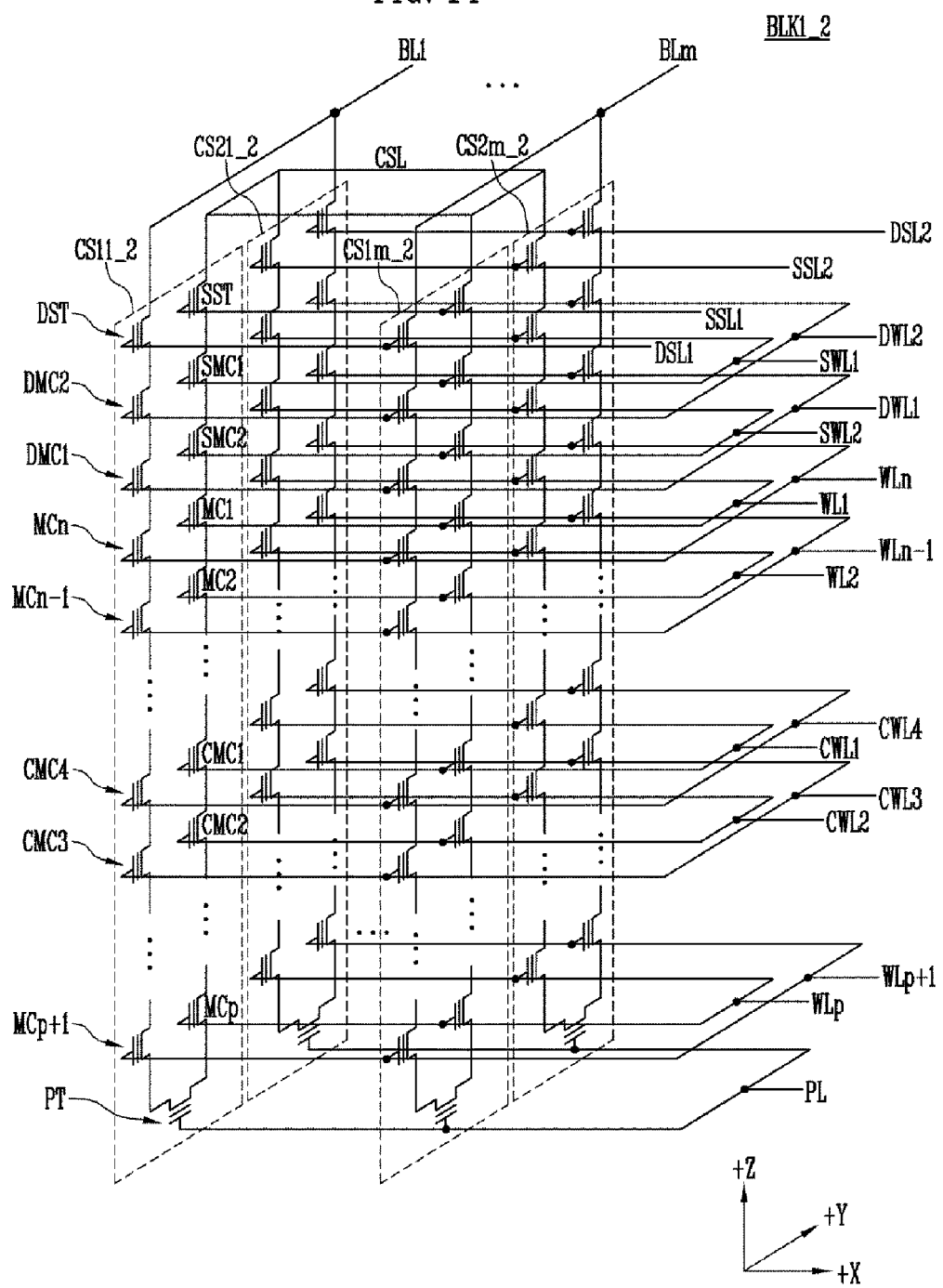
FIG. 14 is a circuit diagram illustrating another embodiment of one of the memory blocks shown in FIG. 2.

FIG. 14 is a circuit diagram illustrating another embodiment (BLK1_2) of one (BLK1) of the memory blocks BLK1 to BLKz shown in FIG. 2.

Referring to FIG. 14, a first memory block BLK1_2 may include cell strings CS11_2 to CS1m_2 and CS21_2 to CS2m_2.

Each of the cell strings CS11_2 to CS1m_2 and CS21_2 to CS2m_2 may include a source selection transistor SST, source side dummy memory cells SMC1 and SMC2, normal memory cells MC1 to MCn, a pipe transistor PT, central dummy memory cells CMC1 to CMC4, drain side dummy memory cells DMC1 and DMC2, and a drain selection transistor DST. In comparison with the embodiment shown in FIG. 3, first to fourth central dummy memory cells CMC1 to CMC4 may be further provided to each cell string. The first and second central dummy memory cells CMC1 and CMC2 may be coupled in series between first to xth normal memory cells MC1 to MCx and (x+1)th to pth normal memory cells MCx+1 to MCp, wherein x is a natural number smaller than p.

The third and fourth central dummy memory cells CMC3 and CMC4 may be coupled in series between (n−x+1)th to nth normal memory cells MCn−x+1 to MCn and (p+1)th to (n−x)th normal memory cells MCp+1 to MCn−x. Gates of the first to fourth central dummy memory cells CMC1 to CMC4 may be coupled to first to fourth central dummy word lines CWL1 to CWL4, respectively.

According to an embodiment, a pillar corresponding to the source selection transistor SST, the source side dummy memory cells SMC1 and SMC2, the normal memory cells MC1 to MCp and the first and second central dummy memory cells CMC1 and CMC2 may include two sub-pillars. For example, the first sub-pillar may be extended from the substrate in a +Z direction, and the second sub-pillar may be extended from the first sub-pillar in the +Z direction. The first and second central dummy memory cells CMC1 and CMC2 may be provided in a region where the first and second sub-pillars contact. Since the first and second central dummy memory cells CMC1 and CMC2 are provided, characteristics of the region where the first and second sub-pillars contact may be complemented.

In the same manner, a pillar corresponding to the drain selection transistor DST, the drain side dummy memory cells DMC1 and DMC2, the normal memory cells MCp+1 to MCn, and the third and fourth central dummy memory cells CMC3 and CMC4 may include two sub-pillars. For example, the corresponding pillar may include a third sub-pillar extending from the substrate in the +Z direction and a fourth sub-pillar extending from the third sub-pillar in the +Z direction. The third and fourth central dummy memory cells CMC3 and CMC4 may be provided in a region where the third and fourth sub-pillars contact. Since the third and fourth central dummy memory cells CMC3 and CMC4 are provided, the region where the third and fourth sub-pillars contact may be complemented.

According to an embodiment, the memory block BLK1_2 may be divided into a plurality of sub-blocks, and an erase operation may be performed in units of the sub-blocks. For example, upper normal memory cells (first to xth normal memory cells and (n−x+1)th to nth normal memory cells) of the cell strings CS11_2 to CS1m_2 and CS21_2 to CS2m_2 may be included in one sub-block, and lower normal memory cells((x+1)th to pth normal memory cells and (p+1)th to (n−x)th normal memory cells) of the cell strings CS11_2 to CS1m_2 and CS21_2 to CS2m_2 may be included in another sub-block. The first to fourth central dummy memory cells CMC1 to CMC4 may be provided in a region where two sub-blocks are adjacent to or contact each other. Since the first to fourth central dummy memory cells CMC1 to CMC4 are provided, the reliability of the normal memory cells may be complemented.

However, the locations of the first to fourth central dummy memory cells CMC1 to CMC4 may vary.

According to an embodiment, a program on central dummy memory cells may be performed at the same time as a program on normal memory cells. Whenever each of the first program pulses is applied to a selected normal word line, at least one of the first to fourth central dummy word lines CWL1 to CWL4 may be biased in the same manner as the selected normal word line.

Figure 15:
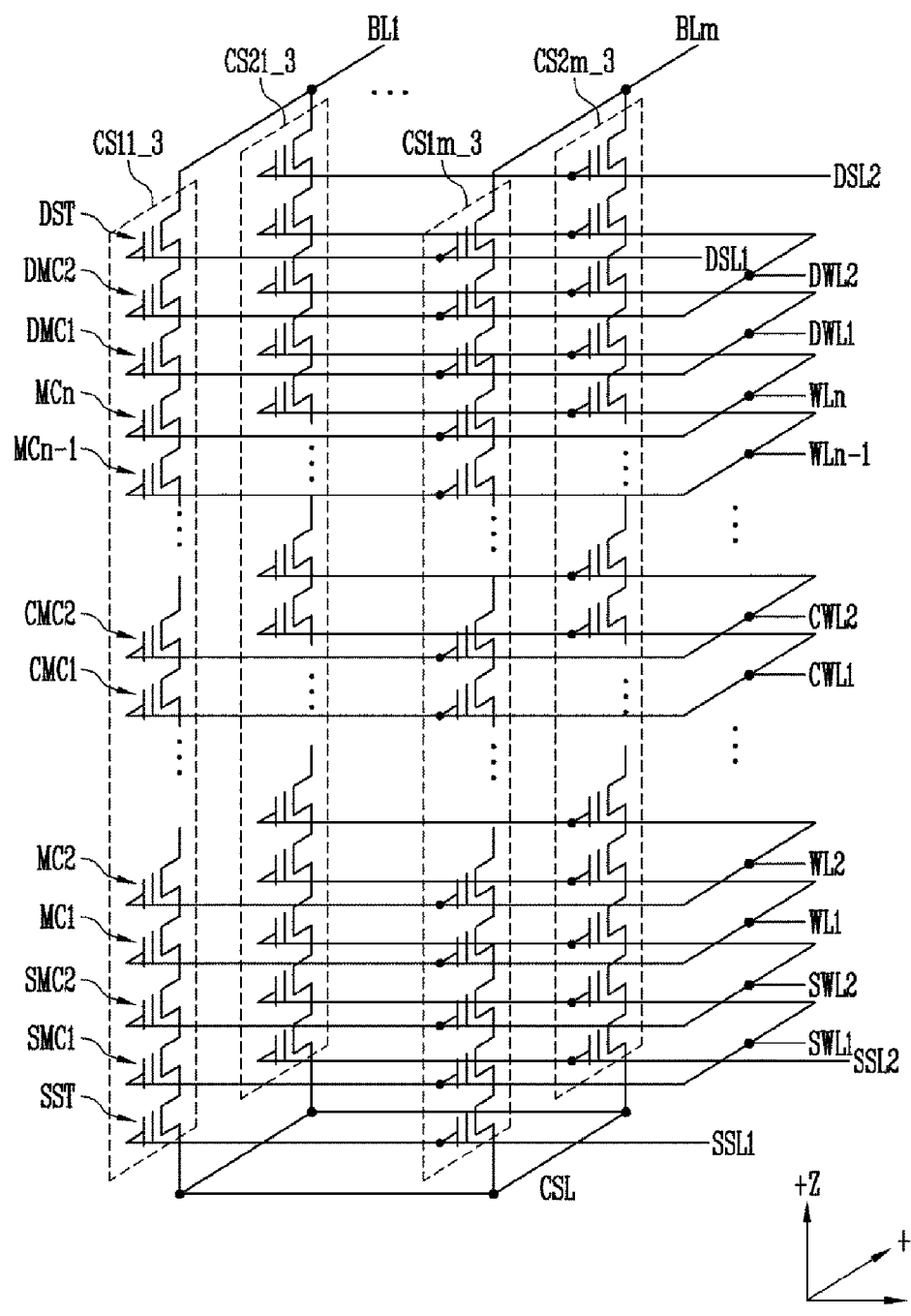
FIG. 15 is a circuit diagram illustrating another embodiment of one of the memory blocks shown in to FIG. 2.

FIG. 15 is a circuit diagram illustrating another embodiment (BLK1_3) of one (BLK1) of the memory blocks BLK1 to BLKz shown in FIG. 2. Such amendment is supported by at least FIGS. 2 and 15.

Referring to FIG. 15, a first memory block BLK1_3 may include cell strings CS11_3 to CS1m_3 and CS21_3 to CS2m_3.

Each of the cell strings CS11_3 to CS1m_3 and CS21_3 to CS2m_3 may include a source selection transistor SST, source side dummy memory cells SMC1 and SMC2, first to nth normal memory cells MC1 to MCn, first and second central dummy memory cells CMC1 and CMC2, drain side dummy memory cells DMC1 and DMC2, and a drain selection transistor DST. In comparison with the embodiment shown in FIG. 4, the first and second central dummy memory cells CMC1 and CMC2 may be further provided to each cell string in this embodiment.

The first and second central dummy memory cells CMC1 and CMC2 may be coupled in series between first to yth normal memory cells MC1 to MCy and (y+1)th to nth normal memory cells MCy+1 to MCn, where y is a natural number smaller than n. Gates of the first and second central dummy memory cells CMC1 and CMC2 may be coupled to the first and second central dummy word lines CWL1 and CWL2, respectively.

According to an embodiment, a pillar corresponding to a single cell string may include two sub-pillars. The first and second central dummy memory cells CMC1 and CMC2 may be provided in a region where the two sub-pillars contact each other.

According to an embodiment, the memory block BLK1_3 may be divided into a plurality of sub-blocks, and an erase operation may be performed in units of the sub-blocks. For example, upper normal memory cells ((y+1)th to nth normal memory cells) of the cell strings CS11_3 to CS1$m$_3 and CS21_3 to CS2$m$_3 may be included in a single sub-block, and lower normal memory cells (first to yth normal memory cells) of the cell strings CS11_3 to CS1$m$_3 and CS21_3 to CS2$m$_3 may be included in another sub-block. The first and second central dummy memory cells CMC1 and CMC2 may be provided in a region where the two sub-blocks are adjacent to or contact each other.

However, the locations of the first and second central dummy memory cells CMC1 and CMC2 may vary.

According to an embodiment, a program on central dummy memory cells may be performed at the same time as a program on normal memory cells. Whenever each of the first program pulses is applied to a selected normal word line, at least one of the first and second central dummy word lines CWL1 and CWL2 may be biased in the same manner as the selected normal word line.

Figure 16:
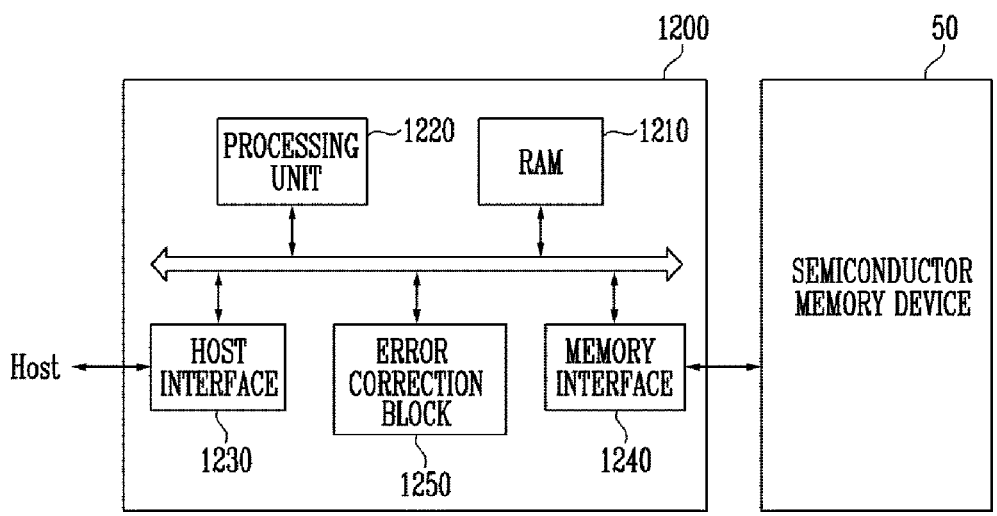
FIG. 16 is a block diagram illustrating a memory system including the semiconductor memory device shown in FIG. 1.

FIG. 16 is a block diagram illustrating a memory system 1000 including the semiconductor memory device 50 shown in FIG. 1.

As illustrated in FIG. 16, the memory system 1000 may include the semiconductor memory device 50 and a controller 1200.

The semiconductor memory device 50 may be configured and operate in the same manner as described above. Thus, a detailed description thereof will be omitted.

The controller 1200 may be coupled to a host and the semiconductor memory device 50. The controller 1200 may access the semiconductor memory device 50 in response to requests of the host. For example, the controller 1200 may control a read operation, a program operation, an erase operation, and/or a background operation of the semiconductor memory device 50. The controller 1200 may provide an interface between the semiconductor memory device 50 and the host. The controller 1200 may be configured to drive firmware for controlling the semiconductor memory device 50.

The controller 1200 may include a random access memory (RAM) 1210, a processing unit 1220, a host interface 1230, a memory interface 1240 and an error correction block 1250.

The RAM 1210 may be used as at least one of the operation memories of the processing unit 1220, a cache memory between the semiconductor memory device 50 and the host, and/or a buffer memory between the semiconductor memory device 50 and the host.

The processing unit 1220 may control operations of the controller 1200. The host interface 1230 may include a protocol for exchanging data between the host and the controller 1200. For example, the controller 1200 may communicate with the host through at least one of various protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, a private protocol, etc.

The memory interface 1240 may interface with the semiconductor memory device 50. For example, the memory interface may include a NAND flash interface or a NOR flash interface.

The memory system 1000 may further include an error correction block 1250. The error correction block 1250 may detect and correct errors in data read from the semiconductor memory device 50 by using an error correction code (ECC).

The controller 1200 and the semiconductor memory device 50 may be integrated in one semiconductor memory device. For example, the controller 1200 and the semiconductor memory device 50 may be integrated in a single semiconductor memory device to form a memory card such as a PC card (personal computer memory card international association (PCMCIA)), a compact flash card (CF), a smart media card (SMC), a memory stick, a multimedia card (MMC, RS-MMC or MMCmicro), an SD card (SD, miniSD, micro SD or SDHC), a universal flash storage device (UFS), etc.

In another example, the controller 1200 and the semiconductor memory device 50 may be integrated as a solid state drive (SSD). The SSD may include a storage device for storing data in a semiconductor memory. When the memory system 1000 is used as an SSD, operational rates of the host coupled to the memory system 1000 may be significantly improved.

In another example, the memory system 1000 may be used as one of several elements in various electronic devices such as a computer, an ultra mobile PC (UMPC), a workstation, a net-book, a personal digital assistant (PDA), a portable computer, a web table, a wireless phone, a mobile phone, a smart phone, an e-book, a portable multimedia player (PMP), a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, devices for home networks, devices for computer networks, devices for telematics networks, an RFID device, other devices for computing systems, etc.

According to an embodiment, the semiconductor memory device 50 or the memory system 1000 may be mounted using various types of packages. For example, the semiconductor memory device 50 and the memory system 1000 may be mounted using packages such as Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline (TSOP), System In Package (SIP), Multi Chip Package (MCP), Wafer-level Fabricated Package (WFP), Wafer-level Processed Stack Package (WSP), and the like.

Figure 17:
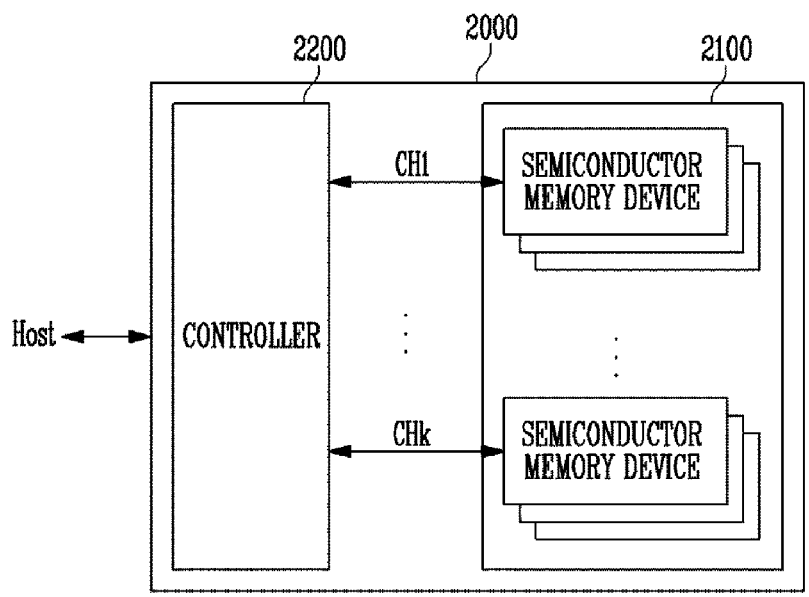
FIG. 17 is a block diagram illustrating an application example of the memory system shown in FIG. 16.

FIG. 17 is a block diagram illustrating an application example (memory system 2000) of the memory system 1000 shown in FIG. 16.

Referring to FIG. 17, the memory system 2000 may include a semiconductor memory device 2100 and a controller 2200. The semiconductor memory device 2100 may include semiconductor memory chips. The semiconductor memory chips may be divided into groups.

FIG. 17 illustrates the groups communicating with the controller 2200 through a single common channel. Each of the semiconductor memory chips may be configured and operate in substantially the same manner as the semiconductor memory device 50 described above with reference to FIG. 1.

Each of the groups may communicate with the controller 2200 through a single common channel. The controller 2200 may be configured in substantially the same manner as the controller 1200 described with reference to FIG. 16, and configured to control the plurality of memory chips of the semiconductor memory device 2100.

As illustrated in FIG. 17, a plurality of semiconductor memory chips may be coupled to a single channel. However, the memory system 2000 may be modified so that a single semiconductor memory chip may be coupled to a single channel.

Figure 18:
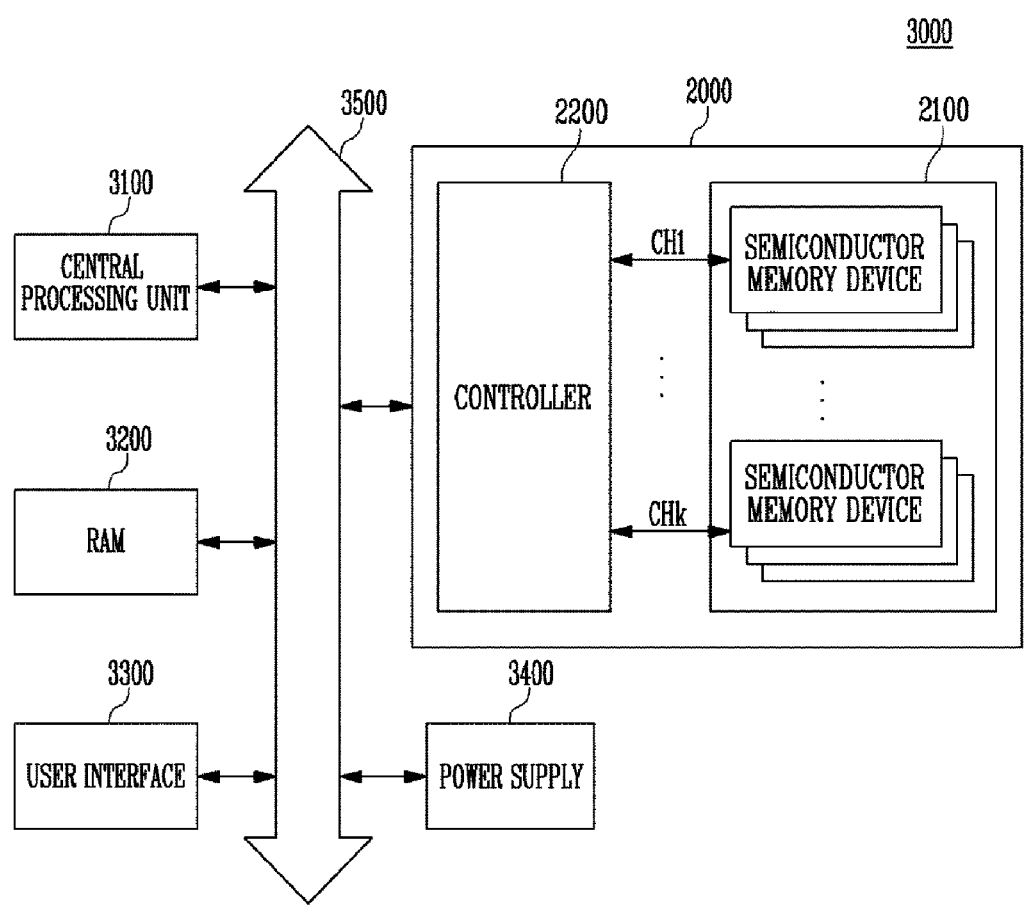
FIG. 18 is a block diagram illustrating a computing system having the memory system described above with reference to FIG. 17.

FIG. 18 is a block diagram illustrating a computing system 3000 having the memory system 2000 described above with reference to FIG. 17.

Referring to FIG. 18, the computing system 3000 may include a central processing unit 3100, a random access memory (RAM) 3200, a user interface 3300, a power supply 3400, a system bus 3500, and the memory system 2000.

The memory system 2000 may be electrically connected to the central processing unit 3100, the RAM 3200, the user interface 3300 and the power supply 3400 through the system bus 3500. Data processed by the central processing unit 3100 may be stored in the memory system 2000.

In FIG. 18, the semiconductor memory device 2100 may be coupled to the system bus 3500 through the controller 2200. However, the semiconductor memory device 2100 may be directly coupled to the system bus 3500. The central processing unit 3100 and the RAM 3200 may perform functions of the controller 2200.

As illustrated in FIG. 18, the memory system 2000 described with reference to FIG. 17 may be provided. However, the memory system 2000 may be replaced with the memory system 1000 as shown in FIG. 16. In some embodiments, the computing system 3000 may include both the memory systems 1000 and 2000 described above with reference to FIGS. 16 and 17, respectively.

According to an embodiment, dummy memory cells may be programmed at the same time as normal memory cells are programmed. Therefore, a separate program operation on the dummy memory cells does not have to be performed. Accordingly, performance of a semiconductor memory device may be improved.

According to an embodiment, a semiconductor memory device having improved performance and a method of operating the same are provided.

What is claimed is:

1. A method of operating a semiconductor memory device including a plurality of cell strings coupled to dummy word lines and normal word lines, the method comprising:
performing a first sub-program operation on selected normal memory cells by sequentially applying first program pulses to a selected normal word line; and
performing a second sub-program operation on the selected normal memory cells by sequentially applying second program pulses having a higher voltage level than the first program pulses to the selected normal word line,
wherein the first program pulses are applied to at least one of the dummy word lines when the first program pulses are applied to the selected normal word line.

2. The method of claim 1, wherein the at least one of the dummy word lines is biased to a program pass pulse lower than the second program pulses whenever each of the second program pulses are applied to the selected normal word line.

3. The method of claim 2, wherein unselected normal word lines are biased to the program pass pulse whenever each of the second program pulses are applied to the selected normal word line.

4. The method of claim 1, wherein unselected normal word lines are biased to a program pass pulse lower than the first program pulses whenever each of the first program pulses are applied to the selected normal word line.

5. The method of claim 1, wherein the at least one of the dummy word lines is adjacent to the selected normal word line.

6. The method of claim 1, wherein the selected normal word line is adjacent to the at least one of the normal word lines.

7. The method of claim 1, wherein the first program pulses are gradually increased by a first step voltage,
a lowest program pulse, among the second program pulses, has a higher voltage level than a highest program pulse, among the first program pulses, by a second step voltage, and
the second step voltage is lower than the first step voltage.

8. The method of claim 7, wherein the second program pulses are gradually increased by the first step voltage.

9. The method of claim 1, wherein the performing of the first sub-program operation comprises:
applying one of the first program pulses to the selected normal word line to perform the first sub-program operation;
determining whether the selected normal memory cells correspond to a program pass by performing a first program verify on the selected normal memory cells by applying a sub-verify voltage to the selected normal word line; and
repeating the first sub-program and the first program verify until the selected normal memory cells correspond to the program pass.

10. The method of claim 9, wherein the performing the second sub-program operation comprises:
applying one of the second program pulses to the selected normal word line;
determining whether the selected normal memory cells correspond to the program pass by performing a second program verify on the selected normal memory cells by applying a target verify voltage to the selected normal word line; and
repeating the second sub-program and the second program verify until the selected normal memory cells correspond to the program pass,
wherein the sub-verify voltage is lower than the target verify voltage.

11. The method of claim 1, wherein each of the plurality of cell strings comprises:
dummy memory cells coupled to the dummy word lines;
normal memory cells coupled to the normal word lines; and
a drain selection transistor coupled between the dummy memory cells and a bit line,
wherein the drain selection transistor, the dummy memory cells and the normal memory cells are coupled in series.

12. The method of claim 1, wherein each of the plurality of cell strings comprises:
dummy memory cells coupled to the dummy word lines;

normal memory cells coupled to the normal word lines; and a source selection transistor coupled between the dummy memory cells and a common source line, wherein the source selection transistor, the dummy memory cells and the normal memory cells are coupled in series.

13. The method of claim 1, wherein the normal word lines are divided into first normal word lines and second normal word lines, and wherein each of the plurality of cell strings comprises:

first normal memory cells coupled to the first normal word lines and second normal memory cells coupled to the second normal word lines;

a pipe transistor coupled to a pipe line; and dummy memory cells coupled to the dummy word lines, wherein a first dummy memory cell, among the dummy memory cells, is coupled between the first normal memory cells and the pipe transistor, and a second dummy memory cell, among the dummy memory cells, is coupled between the second normal memory cells and the pipe transistor.

14. The method of claim 1, wherein each of the plurality of cell strings comprises:

first normal memory cells coupled to first normal word lines;

second normal memory cells coupled to second normal word lines; and dummy memory cells coupled to the dummy word lines, wherein at least one of the dummy memory cells is coupled between the first normal memory cells and the second normal memory cells.

15. A semiconductor memory device, comprising:

a memory cell array including dummy memory cells coupled to dummy word lines and normal memory cells coupled to normal word lines; and a peripheral circuit performing first sub-programs on selected normal memory cells by applying first program pulses to a selected normal word line and performing second sub-programs on the selected normal memory cells by applying second program pulses to the selected normal word line during a program operation, wherein the peripheral circuit applies the first program pulses to a selected dummy word line when the first program pulses are applied to the selected normal word line.

16. The semiconductor memory device of claim 15, wherein the peripheral circuit controls the voltage of the selected dummy word line during each of the second sub-programs in the same manner as an unselected normal word line, among the normal word lines.

* * * * *